(12) United States Patent
Aoyagi et al.

(10) Patent No.: US 10,114,212 B2
(45) Date of Patent: Oct. 30, 2018

(54) DEFLECTOR

(71) Applicants: Isao Aoyagi, Nagakute (JP); Kanae Murata, Nagoya (JP); Takashi Ozaki, Nagakute (JP); Norio Fujitsuka, Nisshin (JP); Yutaka Nonomura, Nagoya (JP); Teruhisa Akashi, Nagoya (JP)

(72) Inventors: Isao Aoyagi, Nagakute (JP); Kanae Murata, Nagoya (JP); Takashi Ozaki, Nagakute (JP); Norio Fujitsuka, Nisshin (JP); Yutaka Nonomura, Nagoya (JP); Teruhisa Akashi, Nagoya (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 1563 days.

(21) Appl. No.: 13/899,077

(22) Filed: May 21, 2013

(65) Prior Publication Data
US 2017/0351088 A1    Dec. 7, 2017

(30) Foreign Application Priority Data

May 29, 2012  (JP) ................. 2012-121812
May 30, 2012  (JP) ................. 2012-123550
Jul. 25, 2012  (JP) ................. 2012-164406

(51) Int. Cl.
*G02B 26/08*     (2006.01)
*G02B 26/10*     (2006.01)
(Continued)

(52) U.S. Cl.
CPC .......... *G02B 26/0841* (2013.01); *B81B 5/00* (2013.01); *G02B 6/3572* (2013.01);
(Continued)

(58) Field of Classification Search
CPC .. G02B 26/0841; G02B 26/10; G02B 26/085; G02B 7/1821; G02B 6/3572; G02B 6/3512; H04N 1/113
(Continued)

(56) References Cited

U.S. PATENT DOCUMENTS 6,122,089 A     9/2000   Minamoto et al.
6,188,502 B1 *  2/2001   Aoki .................... G02B 26/101
                                                    359/198.1
(Continued)

FOREIGN PATENT DOCUMENTS

JP    U-55-137117    9/1980
JP    A-8-220455     8/1996
(Continued)

OTHER PUBLICATIONS

Jan. 5, 2016 Office Action issued in Japanese Patent Application No. 2012-164406.
(Continued)

*Primary Examiner* — Collin X Beatty
(74) *Attorney, Agent, or Firm* — Oliff PLC

(57) ABSTRACT

The present application discloses a deflector including a substrate portion, a movable portion, a reflective portion, a support portion, and a moving mechanism. The movable portion is supported by a first end of the support portion. A second end of the support portion is supported by the substrate portion. An end of the movable portion is capable of coming into contact with the substrate portion. The reflective portion is formed on the movable portion. The moving mechanism is capable of driving the movable portion so as to bring the movable portion into at least any one of a first state, a second state, a third state, and a fourth state.

12 Claims, 32 Drawing Sheets

(51) Int. Cl.
*G02B 26/12* (2006.01)
*B81B 5/00* (2006.01)
*H04N 1/113* (2006.01)
*G02B 7/182* (2006.01)
*G02B 6/35* (2006.01)

(52) U.S. Cl.
CPC ......... *G02B 7/1821* (2013.01); *G02B 26/085* (2013.01); *G02B 26/10* (2013.01); *H04N 1/113* (2013.01); *G02B 6/3512* (2013.01)

(58) Field of Classification Search
USPC .......... 359/199.1–199.4, 200.6–200.8, 198.1
See application file for complete search history.

(56) References Cited

U.S. PATENT DOCUMENTS

| | | | |
|---|---|---|---|
| 6,873,447 | B2 | 3/2005 | Buzzetta |
| 7,136,214 | B2 * | 11/2006 | Loopstra .............. G02B 7/1827 359/200.1 |
| 7,978,388 | B2 * | 7/2011 | Uchiyama ............ G02B 26/101 359/199.2 |
| 8,130,436 | B2 * | 3/2012 | Borchers .............. H04N 9/3129 310/208 |
| 2002/0067534 | A1 | 6/2002 | Holl et al. |
| 2004/0130812 | A1 | 7/2004 | Kondo |
| 2006/0098267 | A1 | 5/2006 | Togawa |
| 2006/0239009 | A1 | 10/2006 | Nanjyo et al. |
| 2009/0021884 | A1 | 1/2009 | Nakamura |
| 2009/0039716 | A1 | 2/2009 | Ogawa et al. |
| 2011/0235019 | A1 | 9/2011 | Matsubara et al. |

FOREIGN PATENT DOCUMENTS

| | | |
|---|---|---|
| JP | A-11-231252 | 8/1999 |
| JP | A-2004-133196 | 4/2004 |
| JP | A-2004-170833 | 6/2004 |
| JP | A-2004-205836 | 7/2004 |
| JP | A-2006-323358 | 11/2006 |
| JP | A-2007-94109 | 4/2007 |
| JP | A-2007-199096 | 8/2007 |
| JP | A-2008-3309 | 1/2008 |
| JP | A-2009-58930 | 3/2009 |
| JP | A-2009-95208 | 4/2009 |
| JP | A-2009-520220 | 5/2009 |
| JP | A-2009-529157 | 8/2009 |
| JP | A-2010-2926 | 1/2010 |
| JP | A-2010-54627 | 3/2010 |
| JP | 2010-210916 A | 9/2010 |
| JP | A-2010-234455 | 10/2010 |
| JP | A-2011-180528 | 9/2011 |
| JP | A-2011-197575 | 10/2011 |
| JP | A-2013-76984 | 4/2013 |
| WO | WO 2004/109359 A1 | 12/2004 |
| WO | WO 2007/075445 A2 | 7/2007 |
| WO | 2007/110928 A1 | 10/2007 |
| WO | WO 2007/117793 A2 | 10/2007 |

OTHER PUBLICATIONS

Japanese Office Action issued in Japanese Patent Application No. 2012-123550 dated Jul. 15, 2014 (with translation).
Japanese Office Action issued in Japanese Patent Application No. 2012-121812 dated Jul. 15, 2014 (with translation).

* cited by examiner

Elevation Angle $\phi$

Elevation Angle $\phi$

Elevation Angle $\phi$

DEFLECTOR

CROSS-REFERENCE TO RELATED APPLICATION(S)

This application claims priority to Japanese Patent Application No. 2012-121812, filed on May 29, 2012, Japanese Patent Application No. 2012-123550, filed on May 30, 2012, and Japanese Patent Application No. 2012-164406, filed on Jul. 25, 2012, the contents of which are hereby incorporated by reference into the present application.

TECHNICAL FIELD

The present application relates to a deflector.

DESCRIPTION OF RELATED ART

Japanese Patent Application Laid-open No. 2007-199096 discloses a deflector. This deflector includes a substrate portion, a support portion having a lower end fixed to the substrate portion, a swing portion swingably placed on an upper end of the support portion, a reflective portion formed on an upper surface of the swing portion, and a drive mechanism applying torque about a swing axis to the swing portion. In this deflector, the drive mechanism swings the swing portion, so that a reflection angle of incident light is changed. In this deflector, the swing portion is formed in a rectangular flat plate shape, and stoppers corresponding to four corners of the swing portion are provided above the swing portion. In the deflector, even when force of separating the swing portion from the support portion acts, the stoppers prevent the swing portion from coming off.

Japanese Patent Application Laid-open No. 2008-3309 discloses a deflector. This deflector includes a substrate portion, a movable portion swingably supported relative to three axes of a pitch axis, a roll axis and a yaw axis at a support point, a position thereof with respect to the substrate portion being substantially fixed, a reflective portion formed on the movable portion such that a reflective surface thereof is orthogonal to the yaw axis, and a drive mechanism rotationally driving the movable portion about the yaw axis such that a contact edge of the movable portion is brought into contact with a surface of the substrate portion. In this deflector, the drive mechanism rotates and drives the movable portion, so that a reflection angle can be adjusted to an arbitrary azimuth angle. The deflector can scan in a direction of longitude.

In other words, the deflector disclosed in Japanese Patent Application Laid-open No. 2008-3309 includes a substrate portion, a swing portion swingably supported relative to at least two axes parallel to the substrate portion at a support point, a position thereof with respect to the substrate portion being substantially fixed, a reflective portion formed on the swing portion, and a drive mechanism swinging the swing portion and causing a contact edge of the swing portion to abut on a contact surface of the substrate portion at a desired azimuth angle. In this deflector, the drive mechanism adjusts the azimuth angle at which the contact edge of the swing portion abuts on the contact surface of the substrate portion, so that a reflection angle can be adjusted to an arbitrary azimuth angle. This deflector can scan in a direction of longitude.

BRIEF SUMMARY OF INVENTION

The present application discloses a deflector including a substrate portion, a movable portion, a reflective portion, a support portion, and a moving mechanism. The movable portion is supported by a first end of the support portion. A second end of the support portion is supported by the substrate portion. An end of the movable portion is capable of coming into contact with the substrate portion. The reflective portion is formed on the movable portion. The moving mechanism is capable of driving the movable portion so as to bring the movable portion into at least any one of a first state, a second state, a third state, and a fourth state. In the first state, a contact position between the movable portion and the substrate portion is in a first direction from the second end of the support portion. In the second state, the contact position between the movable portion and the substrate portion is in a second direction from the second end of the support portion. In the third state, the contact position between the movable portion and the substrate portion is in the first direction from the second end of the support portion. In the fourth state, the contact position between the movable portion and the substrate portion is in the second direction from the second end of the support portion. The first direction and the second direction differ from each other. An angle of the reflective portion in the first state, an angle of the reflective portion in the second state, an angle of the reflective portion in the third state, and an angle of the reflective portion in the fourth state differ from each other.

DETAILED DESCRIPTION OF INVENTION

Figure 1:
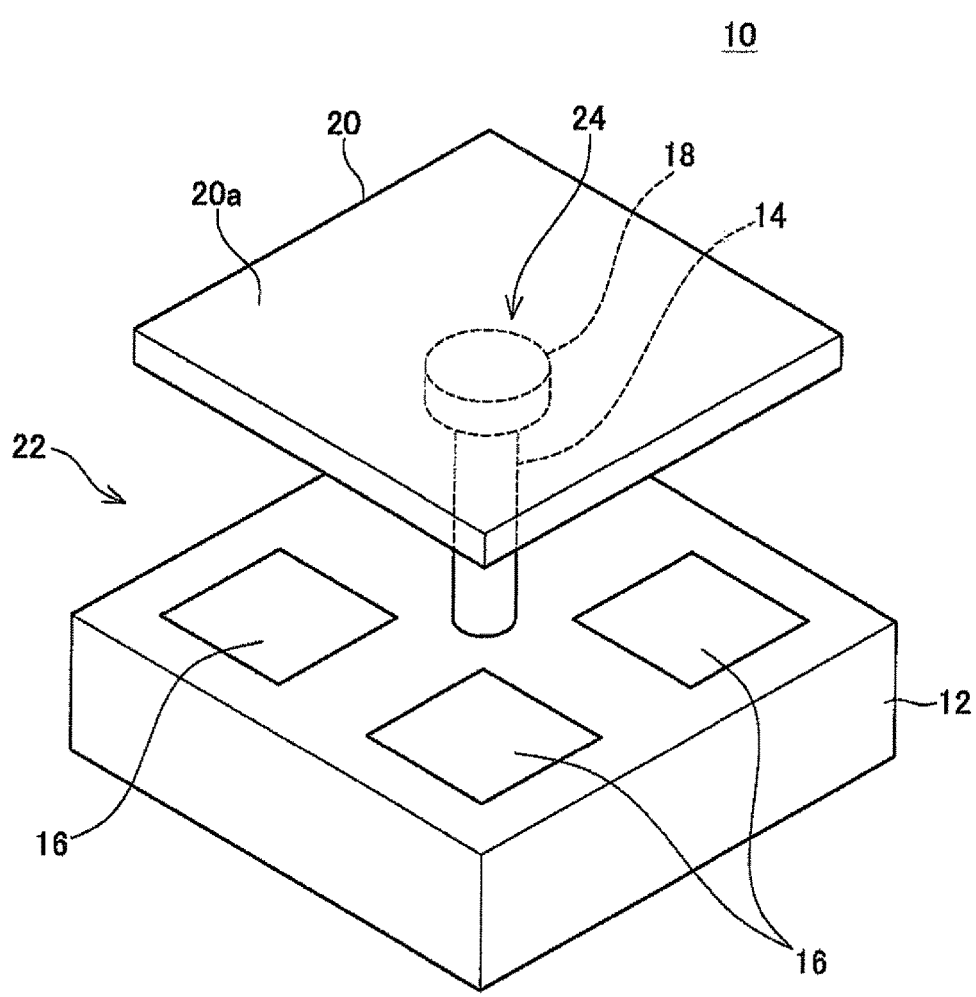
FIG. 1 is a perspective view showing a schematic configuration of a deflector 10 of an embodiment.

In the technology of Japanese Patent Application Laid-open No. 2007-199096, since the stoppers are present above the swing portion, i.e., above the reflective portion, there is a problem that the stoppers block incident light or reflected light, and this substantially reduces a reflection area of the deflector. In a deflector having a swing portion swingably placed on a substrate portion via a support portion, a technology capable of preventing the swing portion from coming off without a stopper provided above the swing portion has been expected.

The present application provides a technology for solving the above-described problem. According to the present application, there is provided a technology capable of preventing a swing portion from coming off without a stopper provided above the swing portion, in a deflector having the swing portion swingably placed on a substrate portion via a support portion.

The deflector disclosed in the present application includes a substrate portion, a support portion having a lower end fixed to the substrate portion, a swing portion swingably placed on an upper end of the support portion, a reflective portion formed on an upper surface of the swing portion, a drive mechanism applying torque about a swing axis to the swing portion, and a biasing mechanism biasing the swing portion toward the support portion, at least when force of separating the swing portion from the support portion acts.

In the above-described deflector, the biasing mechanism biasing the swing portion toward the support portion prevents the swing portion from coming off. The coming off of the swing portion can be prevented without providing a stopper above the swing portion. Additionally, in the above-described deflector, the biasing mechanism biases the swing portion toward the support portion, and hence the deflector can be arranged in a desired direction regardless of a direction in which gravity acts. In the above-described deflector, as long as the biasing mechanism biases the swing portion toward the support portion at least when the force of separating the swing portion from the support portion acts, any biasing mechanism may be employed, for example, a biasing mechanism always biasing the swing portion toward the support portion may be employed, or a biasing mechanism biasing the swing portion toward the support portion only when the force of separating the swing portion from the support portion acts may be employed.

In the above-described deflector, the biasing mechanism can be implemented in various manners. For example, the biasing mechanism may include a magnet provided on at least one of the support portion and the swing portion, and may bias the swing portion toward the support portion by utilizing magnetic force. In this case, the swing portion preferably includes the magnet, and the support portion preferably includes a magnetic material.

Alternatively, the biasing mechanism may include an insulator provided on at least one of the support portion and the swing portion, and voltage applying means for applying a voltage between the support portion and the swing portion, and may bias the swing portion toward the support portion by utilizing electrostatic force.

Alternatively, the biasing mechanism may include non-volatile liquid applied to abutting parts of the swing portion and the support portion, and may bias the swing portion toward the support portion by utilizing surface tension of the non-volatile liquid, when the force of separating the swing portion from the support portion acts. In this case, a part, to which the non-volatile liquid is applied, is preferably subjected to lyophilic treatment.

Alternatively, the biasing mechanism may include an adhesive bonding the abutting parts of the swing portion and the support portion together, and may bias the swing portion toward the support portion by utilizing restoring force of the adhesive, when the force of separating the swing portion from the support portion acts.

Alternatively, the biasing mechanism may include an elastic member connecting the swing portion to the support portion, and may bias the swing portion toward the support portion by utilizing restoring force of the elastic member, when the force of separating the swing portion from the support portion acts.

In the above-described deflector, a convex portion is preferably formed on a part, abutting on the swing portion, of the support portion, and a concave portion is preferably formed on a part, abutting on the support portion, of the swing portion. With such a configuration, it is possible to reliably prevent the swing portion from coming off the support portion.

In another deflector disclosed in the present application includes a substrate portion, a support portion swingably placed on the substrate portion, a swing portion fixed on an upper end of the support portion, a reflective portion formed on an upper surface of the swing portion, a drive mechanism applying torque about a swing axis to the swing portion, and a biasing mechanism biasing the support portion toward the substrate portion, at least when force of separating the support portion from the substrate portion acts.

In the above-described deflector, the biasing mechanism biasing the support portion toward the substrate portion prevents the swing portion from coming off the support portion. The coming off of the swing portion can be prevented without providing a stopper above the swing portion. Additionally, in the above-described deflector, the biasing mechanism biases the support portion toward the substrate portion, and hence the deflector can be arranged in a desired direction regardless of a direction in which gravity acts. In the above-described deflector, as long as the biasing mechanism biases the support portion toward the substrate portion at least when the force of separating the support portion from the substrate portion acts, any biasing mechanism may be employed, for example, a biasing mechanism always biasing the support portion toward the substrate portion may be employed, or a biasing mechanism biasing the support portion toward the substrate portion only when the force of separating the support portion from the substrate portion acts may be employed.

In the above-described deflector, the biasing mechanism can be implemented in various manners. For example, the biasing mechanism may include a magnet provided on at least one of the substrate portion and the support portion, and may bias the support portion toward the substrate portion by utilizing magnetic force. In this case, the substrate portion preferably includes the magnet, and the support portion preferably includes a magnetic material.

Alternatively, the biasing mechanism may include an insulator provided on at least one of the substrate portion and the support portion, and voltage applying means for applying a voltage between the substrate portion and the support portion, and may bias the support portion toward the substrate portion by utilizing electrostatic force.

Alternatively, the biasing mechanism may include non-volatile liquid applied to abutting parts of the substrate portion and the support portion, and may bias the support portion toward the substrate portion by utilizing surface tension of the non-volatile liquid, when the force of separating the support portion from the substrate portion acts. In this case, a part, to which the non-volatile liquid is applied, is preferably subjected to lyophilic treatment.

Alternatively, the biasing mechanism may include an adhesive bonding the abutting parts of the substrate portion and support portion together, and may bias the support portion toward the substrate portion by utilizing restoring force of the adhesive, when the force of separating the support portion from the substrate portion acts.

Alternatively, the biasing mechanism may include an elastic member connecting the swing portion to the substrate portion, and may bias the support portion toward the substrate portion by restoring force of the elastic member, when the force of separating the support portion from the substrate portion acts.

In the above-described deflector, a convex portion is preferably formed on a part, abutting on the substrate portion, of the support portion, and a concave portion is preferably formed on a part, abutting on the support portion, of the substrate portion. With such a configuration, it is possible to reliably prevent the swing portion and the support portion from coming off the substrate portion.

In the technology of Japanese Patent Application Laid-open No. 2008-3309, an elevation angle of the reflective surface with respect to a surface of the substrate portion is constant, and therefore the reflective surface cannot be adjusted at an arbitrary elevation angle, and scanning cannot be performed in a direction of latitude. A deflector capable of scanning not only in the direction of longitude, but also in the direction of latitude has been expected.

The present application provides a technology for solving the above-described problem. According to the present application, there is provided a technology capable of implementing a deflector enabling scanning in both of the direction of longitude and the direction of latitude.

Another deflector disclosed in the present application includes a substrate portion, a movable portion swingably supported relative to three axes of a pitch axis, a roll axis and a yaw axis at a support point, a position thereof with respect to the substrate portion being substantially fixed, a reflective portion formed on the movable portion such that a reflective surface thereof is orthogonal to the yaw axis, and a drive mechanism rotationally driving the movable portion about the yaw axis such that a contact edge of the movable portion is brought into contact with a surface of the substrate portion. In the deflector, a shape of the movable portion is formed such that a distance from the support point to the contact edge changes according to a phase angle.

The phase angle described herein means an angle formed by a reference line of the movable portion as viewing the movable portion from a direction of the yaw axis in plan view. The azimuth angle described herein means an angle formed by a reference line of the substrate portion as viewing the surface of the substrate portion in plan view. The direction of longitude described herein means a direction at which the azimuth angle increases and reduces. The elevation angle described herein means an angle formed by the surface of the substrate portion. The direction of latitude described herein means a direction at which the elevation angle increases and reduces.

In the above-described deflector, the shape of the movable portion is formed such that the distance from the support point to the contact edge changes according to a phase angle $\alpha$. When the movable portion is rotated about the yaw axis such that the contact edge is brought into contact with the substrate portion, a phase angle $\alpha$ of a contact point as viewed from the movable portion also changes with the change of an azimuth angle $\theta$ of the contact point as viewed from the substrate portion, resulting in changes of an elevation angle $\phi$ of the reflective surface. Therefore, a relation between the azimuth angle $\theta$ of the contact point as viewed from the substrate portion, and the elevation angle $\phi$ of the reflective surface will be, for example, shown in FIG. 29.

Figure 29:
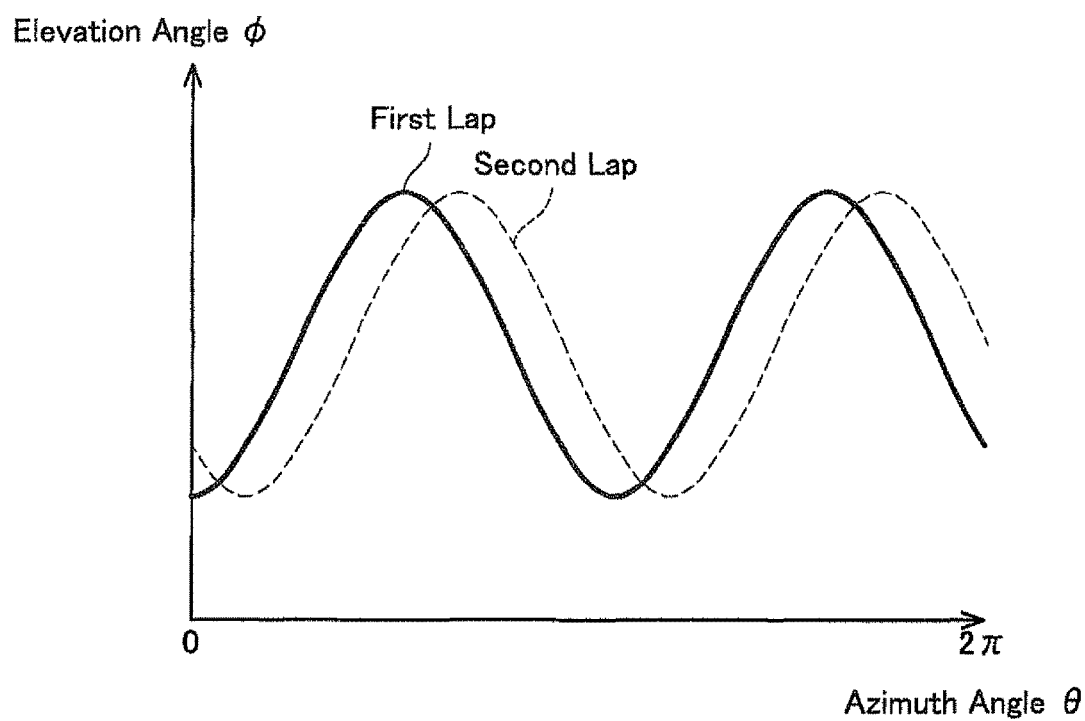
FIG. 29 is a figure showing an example of a relation between an azimuth angle θ of a contact point as viewed from the substrate portion 212, and an elevation angle φ of a reflective surface of the movable plate 216.

As shown in FIG. 29, in the above-described deflector, a different elevation angle $\phi$ with respect to the same azimuth angle $\theta$ is implemented each time the movable portion rotates once. This principle will be described in an embodiment in detail. Consequently, the above-described deflector enables combination of an arbitrary azimuth angle $\theta$ and the elevation angle $\phi$ by repeatedly rotating the movable portion. The deflector enables scanning in both of the direction of longitude and the direction of latitude.

The above-described deflector may be configured so that the movable portion has a shape such that a distance from the support point to the contact edge in a direction orthogonal to the yaw axis changes according to the phase angle. With such a configuration, the movable portion can have a shape such that a distance from the support point to the contact edge changes according to the phase angle. In this case, for example, when viewed on a plane orthogonal to the yaw axis, the contact edge of the movable portion may be an oval centering on the support point. Alternatively, when viewed on the plane orthogonal to the yaw axis, the contact edge of the movable portion may be a circle centering on a position offset from the support point. Alternatively, when viewed on the plane orthogonal to the yaw axis, the contact edge of the movable portion may be a polygon centering on the support point.

The above-described deflector may be also configured so that the movable portion has a shape such that a distance from the reflective surface to the contact edge in a yaw axis direction changes according to the phase angle. With such a configuration, the movable portion can have a shape such that a distance from the support point to the contact edge changes according to the phase angle.

The above-described deflector may include a substrate portion-side support portion, which has a lower end fixed to the substrate portion, and may be configured such that the support point is provided on an upper end of the substrate portion-side support portion. Additionally, the above-described deflector may include a movable portion-side support portion, which has an upper end fixed to the movable portion, and may be configured such that the support point is provided on an lower end of the movable portion-side support portion.

Another deflector disclosed in the present application includes a substrate portion, a swing portion swingably supported relative to at least two axes parallel to the substrate portion at a support point, a position thereof with respect to the substrate portion being substantially fixed, a reflective portion formed on the swing portion, a drive mechanism causing the swing portion to swing, and causing a contact edge of the swing portion to abut on a contact surface of the substrate portion at a desired azimuth angle, an adjustment mechanism adjusting a distance from the support point to the contact surface in a direction orthogonal to the substrate portion.

The azimuth angle described herein means an angle formed by a reference line of the substrate portion as viewing a surface of the substrate portion in plan view. A direction of longitude described herein means a direction in which the azimuth angle increases and reduces. An elevation angle described herein means a direction formed by the surface of the substrate portion. A direction of latitude described herein means a direction in which the elevation angle increases and reduces.

According to the above-described deflector, the azimuth angle, at which the drive mechanism causes the contact edge of the swing portion to abut on the contact surface of the substrate portion, is adjusted, so that a reflection angle can be adjusted to an arbitrary azimuth angle. Additionally, according to the above-described deflector, the adjustment mechanism adjusts the distance from the support point to the contact surface in the direction orthogonal to the substrate portion, so that an elevation angle of the swing portion, at which the contact edge of the swing portion abuts on the contact surface of the substrate portion, can be adjusted, and the reflection angle can be adjusted to an arbitrary elevation angle. According to the above-described deflector, it is possible to scan not only in the direction of longitude but also in the direction of latitude.

The above-described deflector may include a support member supported by the substrate portion and provided with a support point on an end in a direction orthogonal to the substrate portion, and may be configured such that the above-described adjustment mechanism adjusts a protrusion amount of the support point from the substrate portion.

According to the above-described deflector, the protrusion amount of the support point from the substrate portion can be adjusted, so that the elevation angle of the swing portion when the contact edge of the swing portion abuts on the contact surface of the substrate portion can be adjusted, and the reflection angle can be adjusted to an arbitrary elevation angle.

Alternatively, the above-described deflector may include a contact member supported by the substrate portion and formed with a contact surface, and may be configured such that the adjustment mechanism adjusts a protrusion amount, from the substrate portion, of the contact surface, on which the contact edge of the swing portion abuts.

According to the above-described deflector, the protrusion amount of the contact surface from the substrate portion is adjusted, so that the elevation angle of the swing portion when the contact edge of the swing portion abuts on the contact surface of the substrate portion can be adjusted, and the reflection angle can be adjusted to an arbitrary elevation angle.

Embodiment

FIG. 1 shows a deflector 10 of this embodiment. The deflector 10 mainly includes a substrate 12, a support member 14, a connecting member 18, a swing plate 20, a drive mechanism 22, and a biasing mechanism 24. A reflective film 20a reflecting incident light is formed on an upper surface of the swing plate 20. The deflector 10 causes the swing plate 20 to swing with respect to the substrate 12, thereby changing a reflection angle of the incident light by the reflective film 20a. The substrate 12 is formed, for example, in a silicon wafer. The swing plate 20 is formed, for example, from silicon. The reflective film 20a is an evaporated film such as Al.

A lower end of the support member 14 is fixed to a center of an upper surface of the substrate 12. The connecting member 18 is fixed to a center of a lower surface of the swing plate 20. The swing plate 20 is swingably placed in a state in which the connecting member 18 abuts on an upper end of the support member 14.

The drive mechanism 22 applies torque about a swing axis to the swing plate 20, thereby swinging the swing plate 20. A peripheral edge of the swing plate 20 abuts on the substrate 12, thereby defining a swing angle in swinging of the swing plate 20. Alternatively, in a case where restoring force acts when torque about the swing axis is applied to the swing plate 20, the swing angle is defined by a position where the torque and the restoring force balance. In this embodiment, electrodes 16 formed on the substrate 12, and an electrode (not shown) formed on the swing plate 20 configure the drive mechanism 22. A voltage is applied between the electrodes 16 formed on the substrate 12, and the electrode formed on the swing plate 20, so that electrostatic force acts between both the electrodes, and torque about the swing axis is applied to the swing plate 20.

The biasing mechanism 24 biases the swing plate 20 toward the support member 14, at least when force of separating the swing plate 20 from the support member 14 acts. The biasing mechanism 24 can prevent the swing plate 20 from coming off the support member 14.

Figure 2:
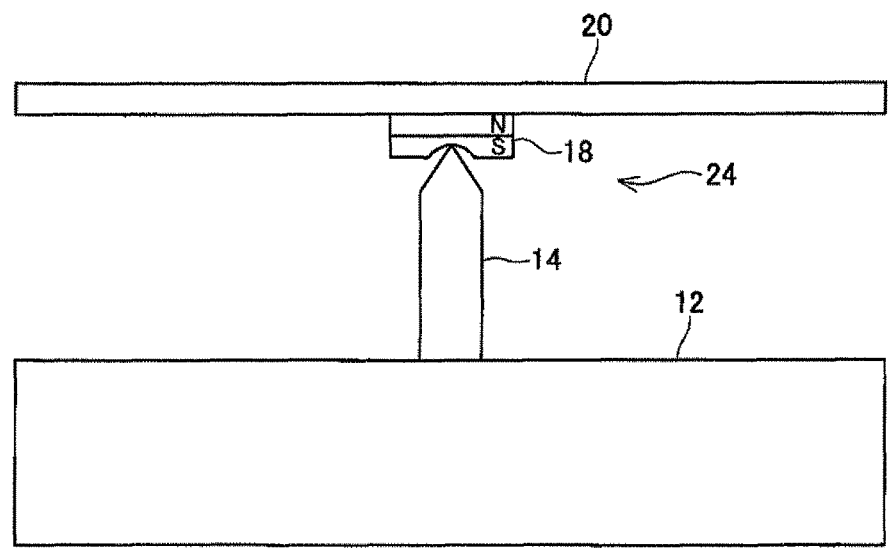
FIG. 2 is a side view showing an example of a configuration where a biasing mechanism 24 biases a swing plate 20 toward a support member 14 by utilizing magnetic force.

In the deflector 10 of this embodiment, the swing plate 20 is biased toward the support member 14 by using magnetic force, thereby implementing the biasing mechanism 24. As shown in FIG. 2, the support member 14 is formed by a magnetic material such as Ni. The connecting member 18 is formed by a magnet such as an electromagnet and a permanent magnet. The connecting member 18 is fixed to a lower surface of the swing plate 20 by using, for example, an adhesive. A polar direction of the magnetic force of the connecting member 18 is arranged in a direction orthogonal to the swing plate 20. A convex portion is formed on a tip of the support member 14, and a concave portion is formed on a center of a lower surface of the connecting member 18. The convex portion on the tip of the support member 14 abuts on the concave portion of the connecting member 18, so that the swing plate 20 is swingably supported by the support member 14. With such a configuration, the swing plate 20 is always biased toward the support member 14 by magnetic force acting between the support member 14 and the connecting member 18, and the swing plate 20 can be prevented from coming off the support member 14.

As long as the convex portion abuts on the concave portion of the connecting member 18, and can swingably support the swing plate 20, any shape of the convex portion on the tip of the support member 14 may be employed. For example, the convex portion may be formed in a triangular pyramid, or a hemisphere. As long as the concave portion of the connecting member 18 abuts on the convex portion on the tip of the support member 14, and the swing plate 20 is swingably supported, the concave portion of the connecting member 18 may be formed in any shape.

Figure 3:
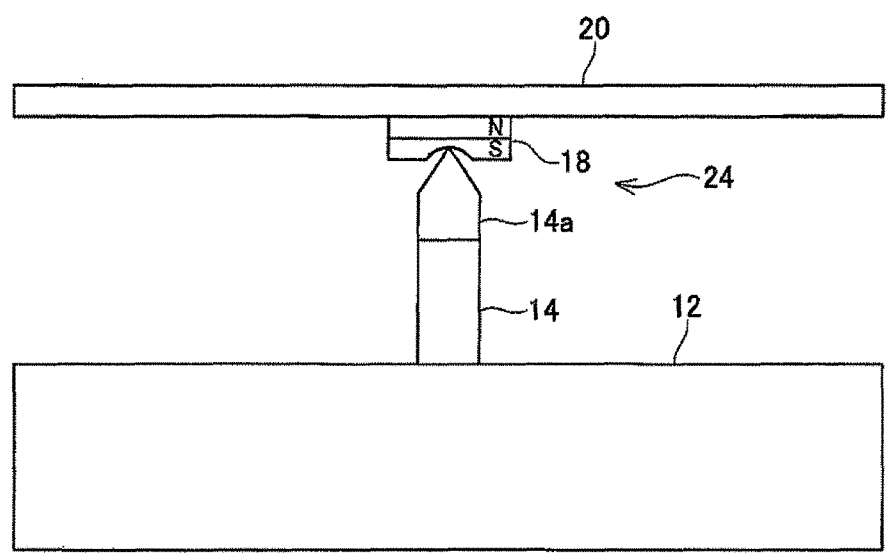
FIG. 3 is a side view showing another example of a configuration where the biasing mechanism 24 biases the swing plate 20 toward the support member 14 by utilizing magnetic force.

The support member 14 may be entirely formed by a magnetic material such as Ni as described above, or the support member 14 may be entirely formed by a non-magnetic material such as Al and only the tip part may be plated with a plating 14a of a magnetic material such as Ni, as shown in FIG. 3.

Figure 4:
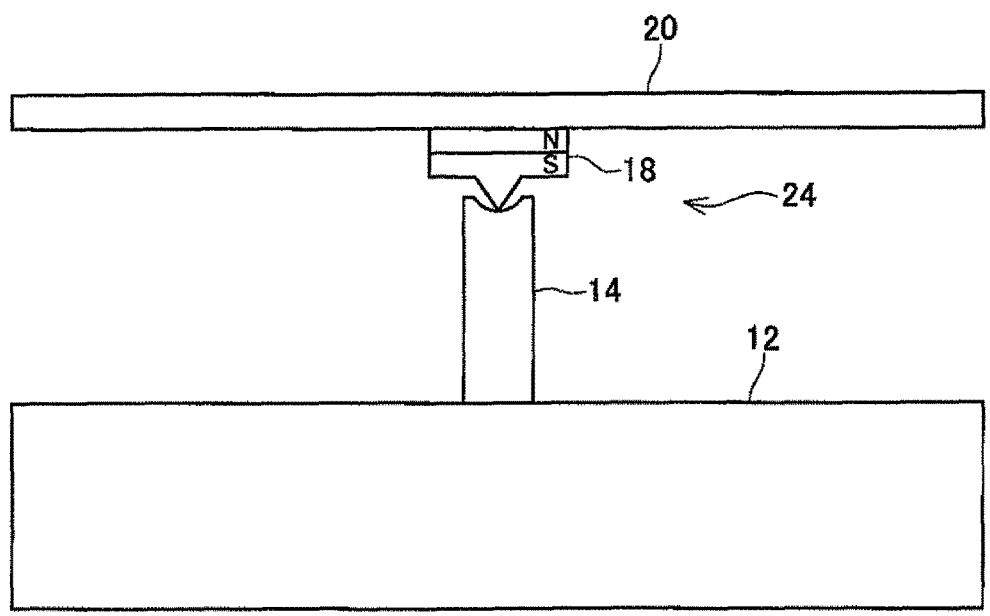
FIG. 4 is a side view showing another example of a configuration where the biasing mechanism 24 biases the swing plate 20 toward the support member 14 by utilizing magnetic force.

As shown in FIG. 4, the convex portion may be formed on the connecting member 18, and the concave portion may be formed on the tip of the support member 14. Also in this case, the support member 14 may be entirely formed by a magnetic material, or the support member 14 may be entirely formed by a non-magnetic material and only the tip part may be plated by a magnetic material.

Figure 5:
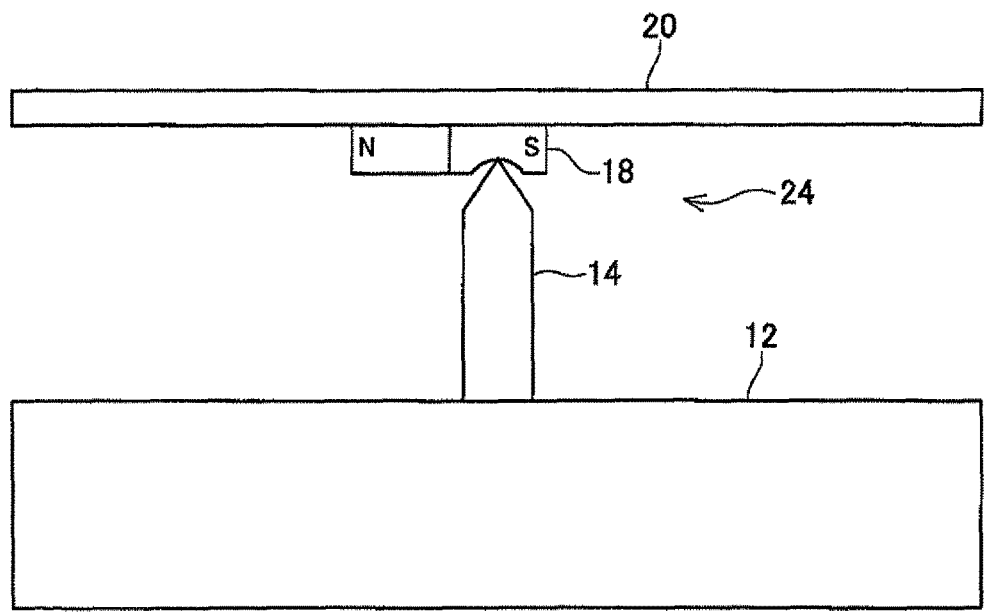
FIG. 5 is a side view showing another example of a configuration where the biasing mechanism 24 biases the swing plate 20 toward the support member 14 by utilizing magnetic force.

As shown in FIG. 5, the polar direction of the magnetic force of the connecting member 18 may be arranged in a direction along the swing plate 20.

Figure 6:
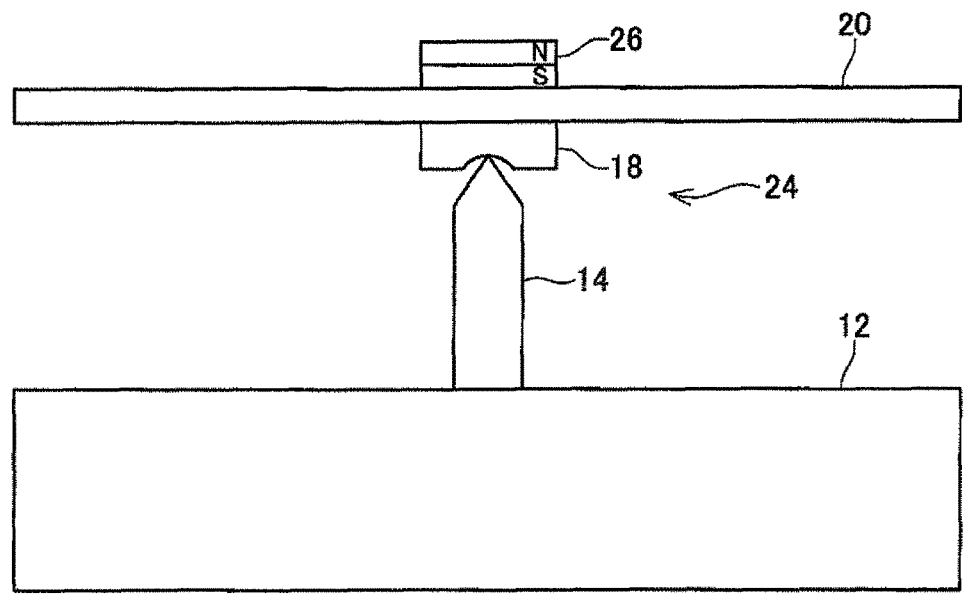
FIG. 6 is a side view showing another example of a configuration where the biasing mechanism 24 biases the swing plate 20 toward the support member 14 by utilizing magnetic force.

As shown in FIG. 6, a magnet 26 such as an electromagnet and a permanent magnet may be provided on the swing plate 20, in addition to the connecting member 18 abutting on the support member 14. With such a configuration, the swing plate 20 is always biased toward the support member 14 by magnetic force acting between the support member 14 and the magnet 26, and the swing plate 20 can be prevented from coming off the support member 14.

Figure 7:
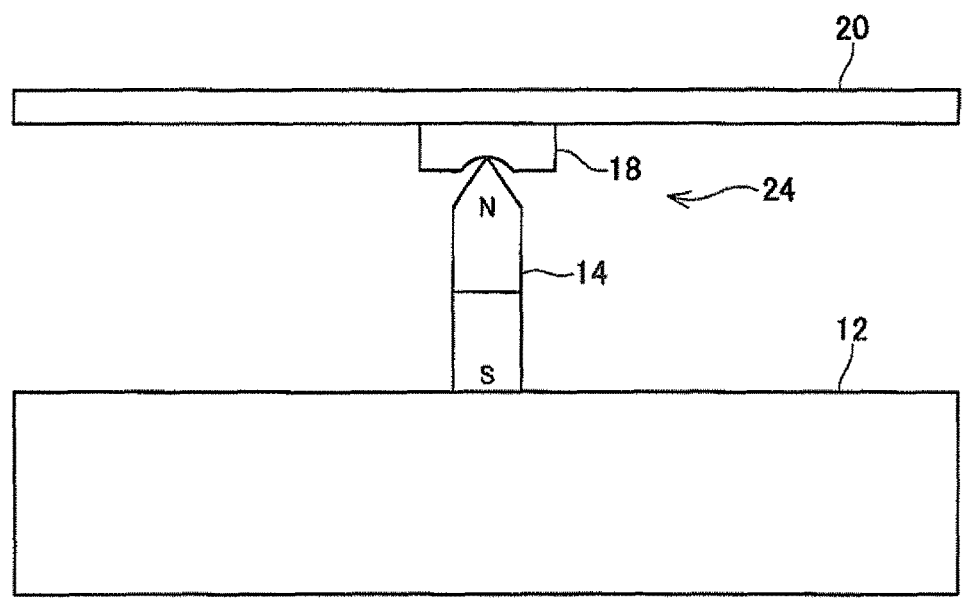
FIG. 7 is a side view showing another example of a configuration where the biasing mechanism 24 biases the swing plate 20 toward the support member 14 by utilizing magnetic force.

As shown in FIG. 7, the support member 14 may be formed by a magnet such as an electromagnet and a permanent magnet, and the connecting member 18 may be formed by a magnetic material such as Ni. In this case, the connecting member 18 may be entirely formed by a magnetic material, or only a part, abutting on the support member 14, of the connecting member 18 may be plated by a magnetic material. In this case, the convex portion may be formed on the connecting member 18, and the concave portion may be formed on the tip of the support member 14.

Figure 8:
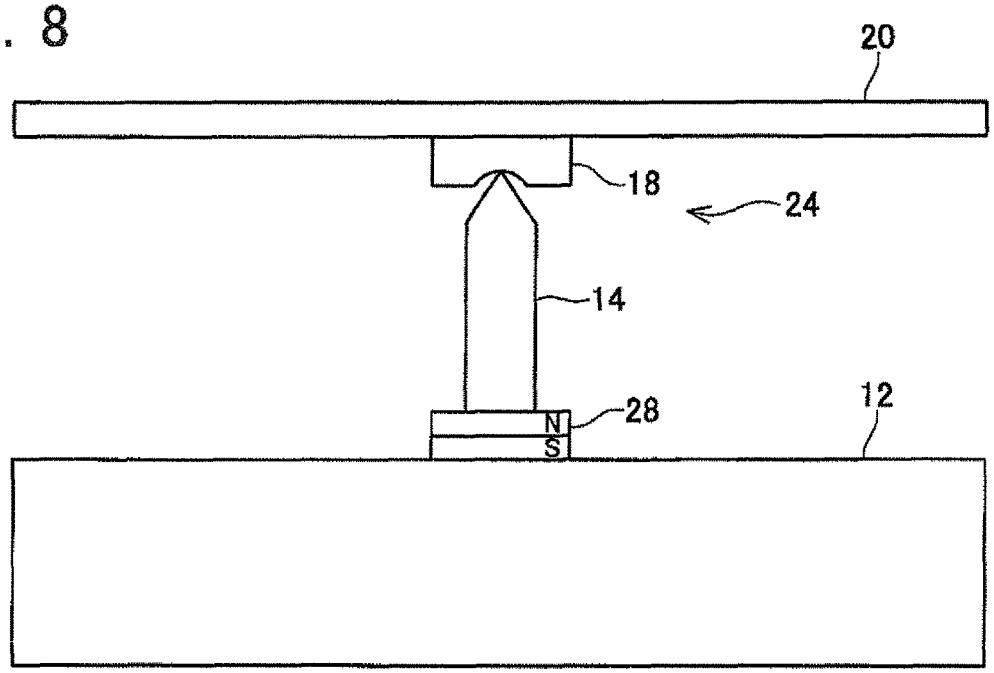
FIG. 8 is a side view showing another example of a configuration where the biasing mechanism 24 biases the swing plate 20 toward the support member 14 by utilizing magnetic force.

Alternatively, as shown in FIG. 8, a magnet 28 such as an electromagnet and a permanent magnet may be provided on the substrate 12, in addition to the support member 14 abutting on the connecting member 18. With such a configuration, the swing plate 20 is always biased toward the support member 14 by magnetic force acting between the magnet 28 and the connecting member 18, and the swing plate 20 can be prevented from coming off the support member 14.

Figure 9:
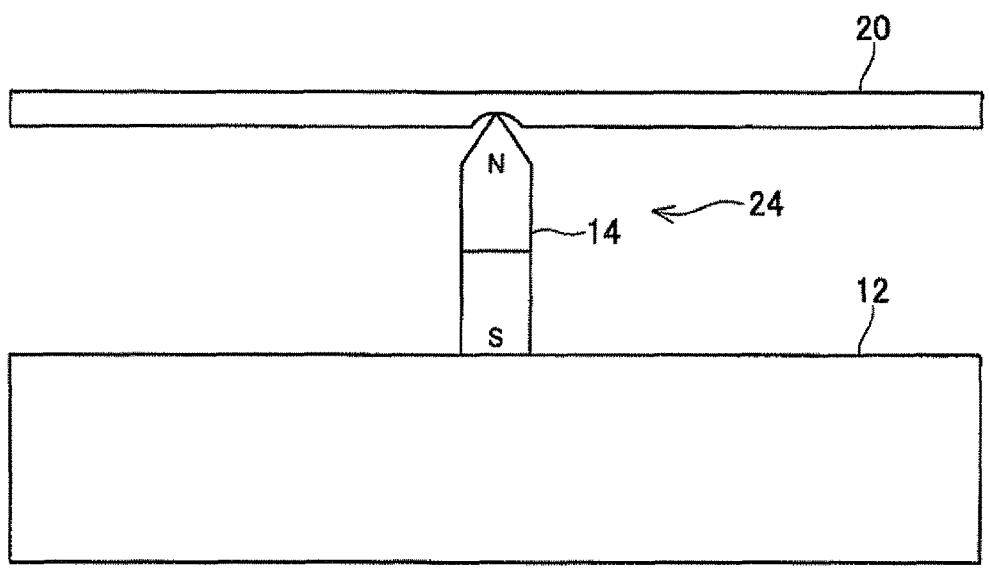
FIG. 9 is a side view showing another example of a configuration where the biasing mechanism 24 biases the swing plate 20 toward the support member 14 by utilizing magnetic force.

Alternatively, as shown in FIG. 9, the tip of the support member 14 may directly abut on the swing plate 20 without providing the connecting member 18, and the swing plate 20 may be swingably supported. In this case, the swing plate 20 may be entirely formed by a magnetic material, or only a part, abutting a part, abutting on the support member 14, of the swing plate 20 may be plated by a magnetic material. As shown in FIG. 9, the convex portion may be formed on the tip of the support member 14, and the concave portion may be formed on the swing plate 20. Alternatively, the concave portion may be formed on the tip of the support member 14, and the convex portion may be formed on the swing plate 20.

Although the biasing mechanism 24 biases the swing plate 20 toward the support member 14 by magnetic force in the above description, the biasing mechanism 24 may bias the swing plate 20 toward the support member 14 by utilizing other kind of force.

Figure 10:
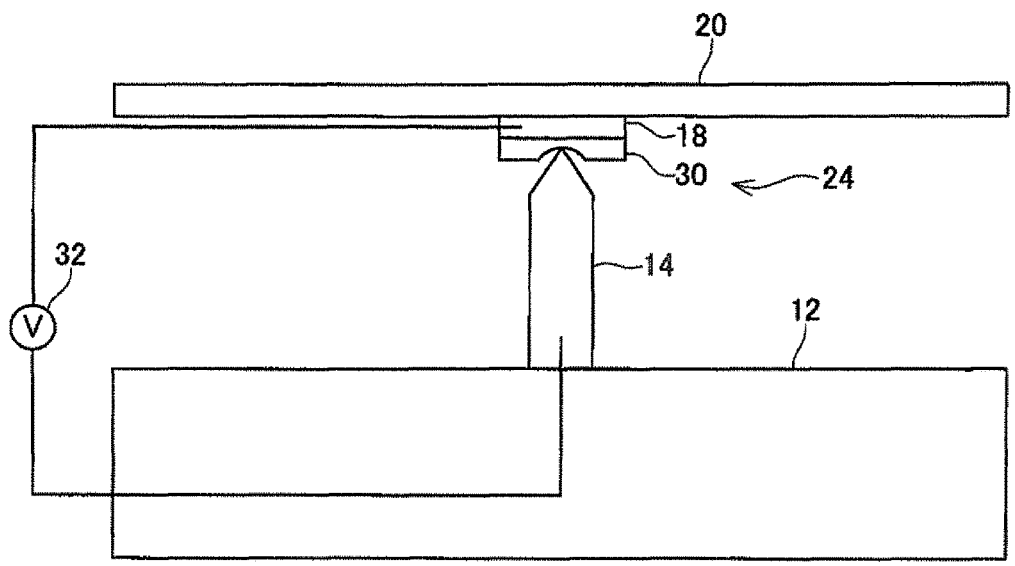
FIG. 10 is a side view showing an example of a configuration where the biasing mechanism 24 biases the swing plate 20 toward the support member 14 by utilizing electrostatic force.

For example, as shown in FIG. 10, an insulator 30 is provided on the part, abutting on the support member 14, of the connecting member 18, a voltage applying mechanism 32 applies a voltage between the support member 14 and the connecting member 18, thereby also enabling the biasing mechanism 24 utilizing electrostatic force to be implemented. In this case, the swing plate 20 is always biased toward the support member 14 by electrostatic force acting between the support member 14 and the connecting member 18. As long as conduction between the support member 14 and the connecting member 18 can be prevented, the insulator 30 may be arranged in any manner. For example, the insulator 30 may be provided on a part, abutting on the connecting member 18, of the support member 14, or may be provided on both of the support member 14 and the connecting member 18.

Figure 11:
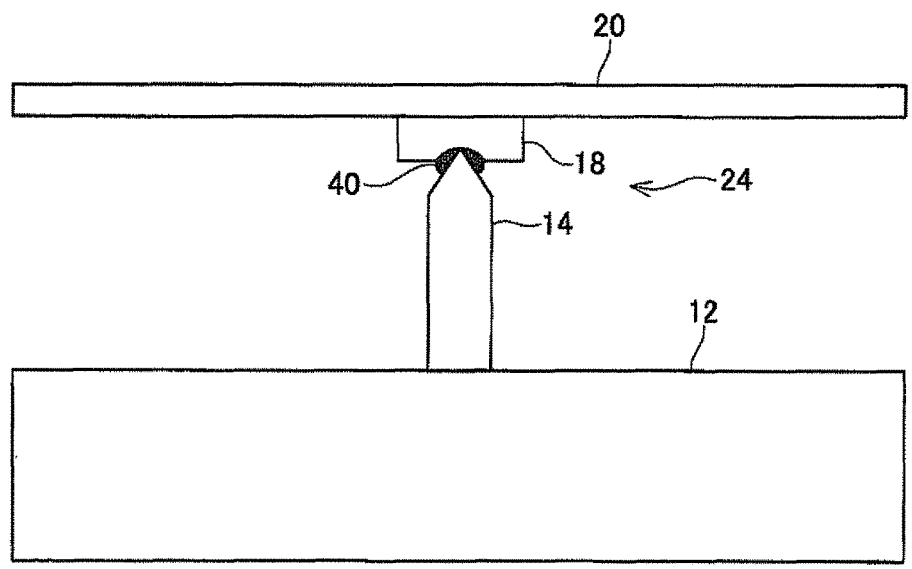
FIG. 11 is a side view showing an example of a configuration where the biasing mechanism 24 biases the swing plate 20 toward the support member 14 by utilizing surface tension of a non-volatile liquid 40.

Alternatively, as shown in FIG. 11, non-volatile liquid 40 is applied to abutting portions of the support member 14 and the connecting member 18, thereby also enabling the biasing mechanism 24 to be implemented. In this case, when force of separating the swing plate 20 from the support member 14 acts, the swing plate 20 is biased toward the support member 14 by surface tension of the non-volatile liquid 40, thereby enabling the swing plate 20 to be prevented from coming off the support member 14. In a case of the configuration shown in FIG. 11, portions, applied with the non-volatile liquid 40, of the support member 14 and/or the connecting member 18 may be subjected to lyophilic surface treatment. Particularly, in a case where the non-volatile liquid 40 is oil, the portions, applied with the non-volatile liquid 40, of the support member 14 and/or the connecting member 18 may be subjected to lipophilic surface treatment. As the non-volatile liquid 40, for example, silicon oil or grease may be used.

Figure 12:
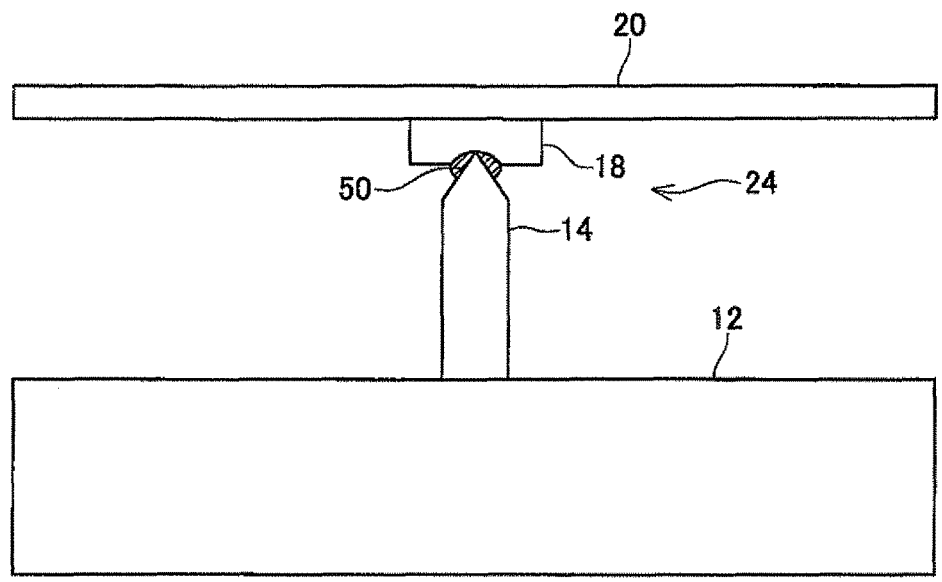
FIG. 12 is a side view showing an example of a configuration where the biasing mechanism 24 biases the swing plate 20 toward the support member 14 by utilizing restoring force of a soft adhesive 50.

Alternatively, as shown in FIG. 12, the abutting portions of the support member 14 and the connecting member 18 are bonded together by a soft adhesive 50, thereby also enabling the biasing mechanism 24 to be implemented. In this case, when the force of separating the swing plate 20 from the support member 14 acts, the swing plate 20 is biased toward the support member 14 by restoring force of the soft adhesive 50, thereby enabling the swing plate 20 to be prevented from coming off the support member 14. As the soft adhesive 50, for example, an epoxy adhesive or silicon rubber may be used.

Figure 13:
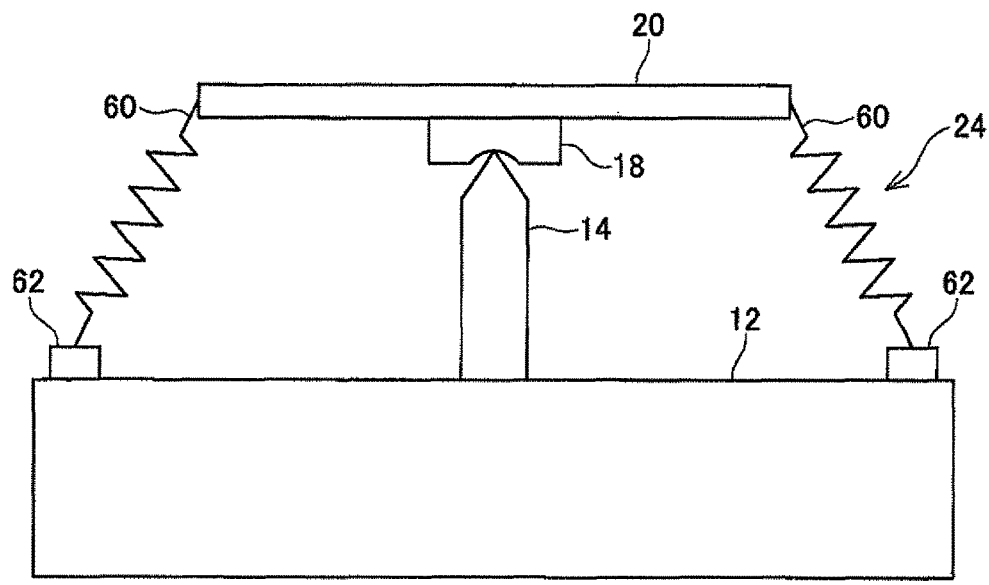
FIG. 13 is a side view showing an example of a configuration where the biasing mechanism 24 biases the swing plate 20 toward the support member 14 by utilizing restoring force of elastic members 60.

Alternatively, as shown in FIG. 13, the swing plate 20 and the substrate 12 are connected to each other by using elastic members 60 having elasticity in a direction orthogonal to the swing plate 20 (vertical direction in FIG. 13), thereby also enabling the biasing mechanism 24 to be implemented. In an example shown in FIG. 13, the elastic members 60 connect between fixed members 62 fixed to the substrate 12, and the peripheral edge of the swing plate 20. In this case, when the force of separating the swing plate 20 from the support member 14 acts, the swing plate 20 is biased toward the support member 14 by restoring force of the elastic members 60, thereby enabling the swing plate 20 to be prevented from coming off the support member 14.

Figure 14:
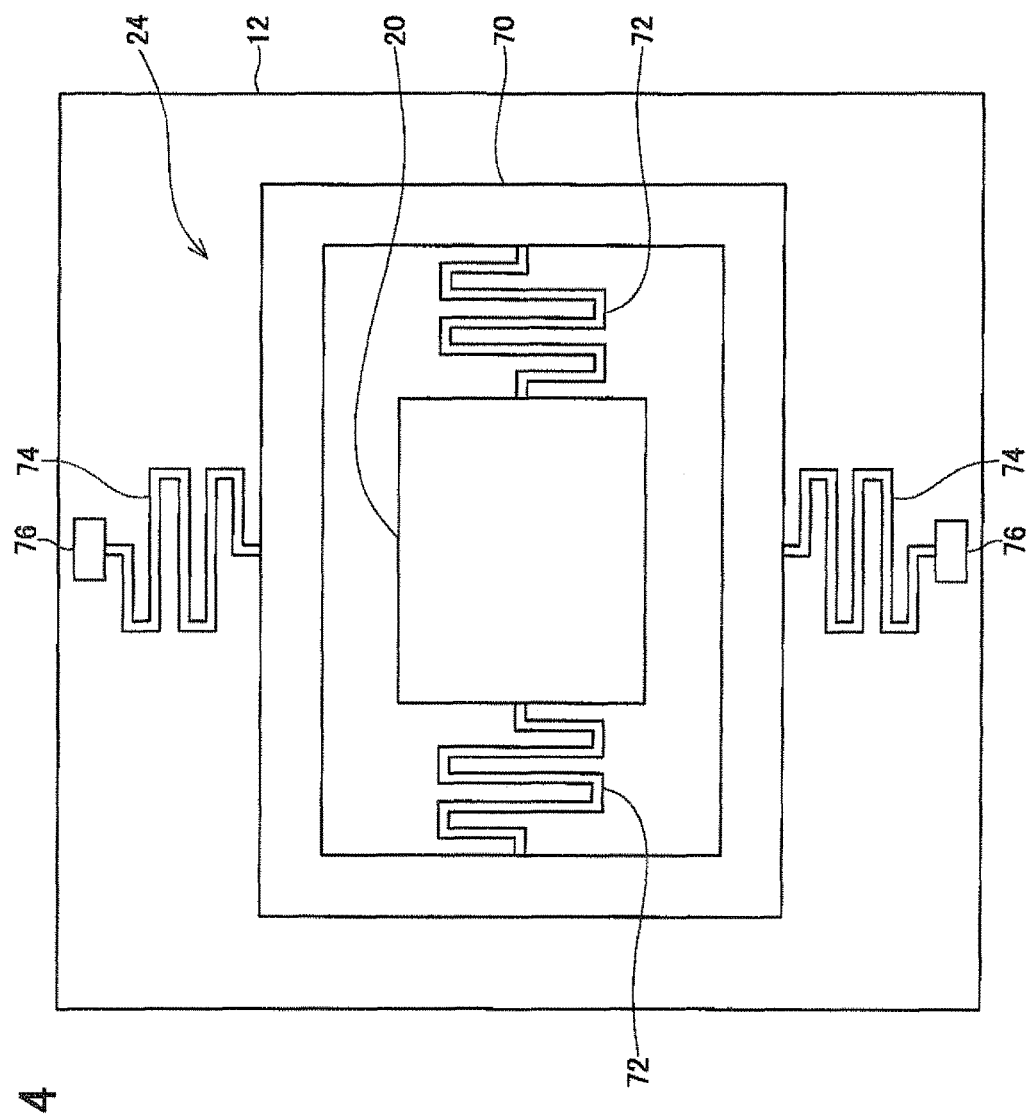
FIG. 14 is a plan view showing an example of a configuration where the biasing mechanism 24 biases the swing plate 20 toward the support member 14 by utilizing restoring force of elastic members 72, 74.
Figure 15:
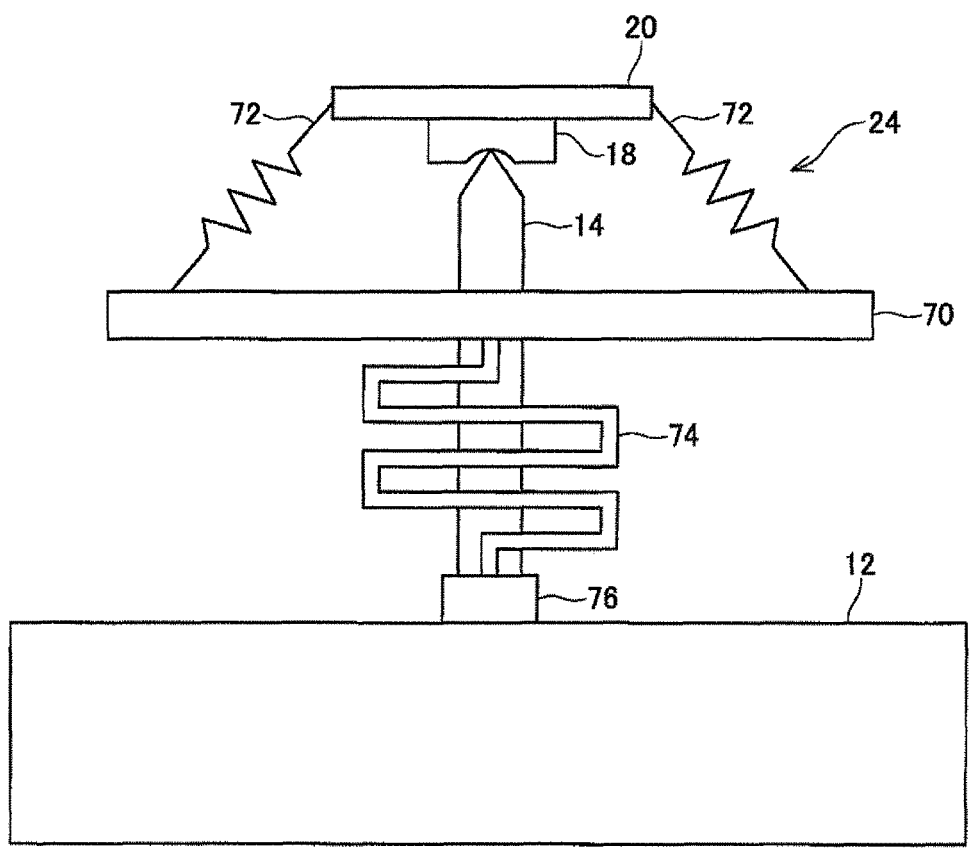
FIG. 15 is a side view of the configuration of FIG. 14.

FIG. 14 and FIG. 15 each show a configuration where the swing plate 20 is connected to the substrate 12 by using an intermediate support plate 70, and two pairs of elastic members 72, 74. As shown in FIG. 14, the elastic members 72, 74 may be, for example, meander beams. In this case, corners of bending portions are rounded, thereby enabling durability of the elastic members 72, 74 to be improved. The elastic members 72 connect the peripheral edge of the swing plate 20 to the intermediate support plate 70. The elastic members 74 connect between the intermediate support plate 70 and fixed members 76 fixed to the substrate 12. With such a configuration, when the force of separating the swing plate 20 from the support member 14 acts, the swing plate 20 is biased toward the support member 14 by restoring force of the elastic members 72, 74, thereby enabling the swing plate 20 to be prevented from coming off the support member 14.

Although the drive mechanism 22 applies torque to the swing plate 20 by utilizing electrostatic force in the above description, the drive mechanism 22 may apply torque to the swing plate 20 by utilizing other kind of force.

Figure 16:
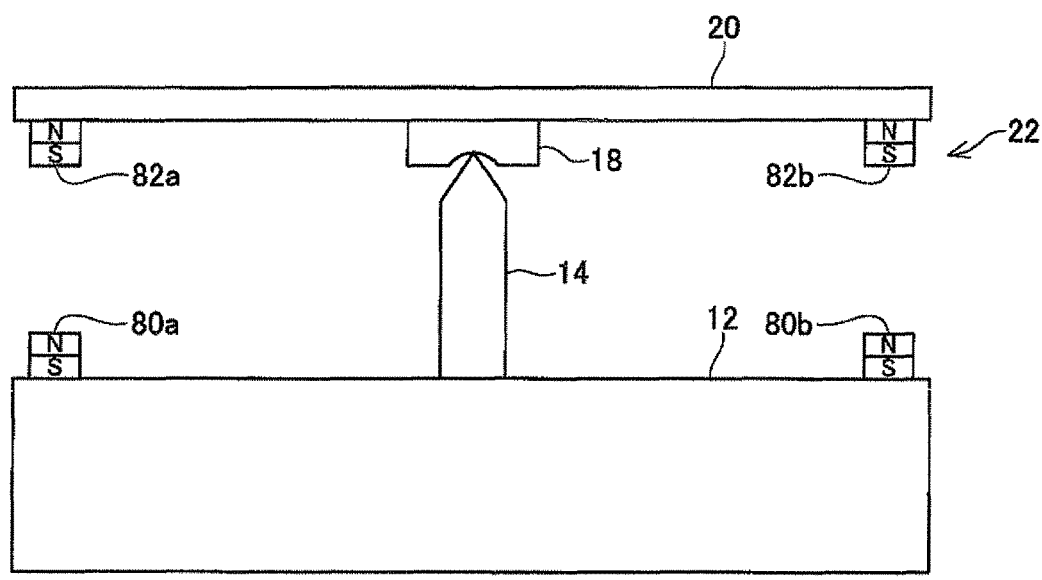
FIG. 16 is a side view showing an example of a configuration where a drive mechanism 22 applies torque to the swing plate 20 by using magnetic force.

For example, as shown in FIG. 16, electromagnets 80a, 80b may be arranged on the substrate 12, electromagnets 82a, 82b may be arranged on the swing plate 20, and torque is applied to the swing plate 20 by controlling ON/OFF of the respective electromagnets.

Figure 17:
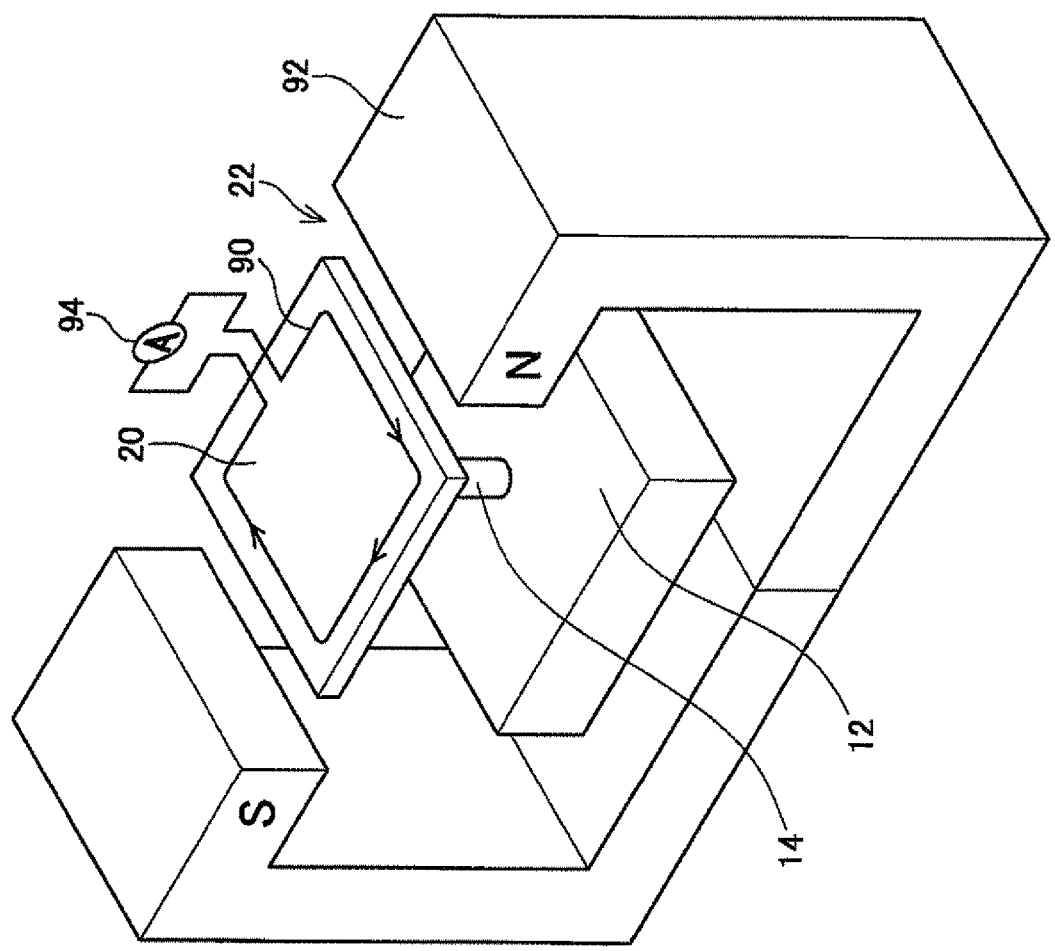
FIG. 17 is a side view showing an example of a configuration where the drive mechanism 22 applies torque to the swing plate 20 by using Lorentz force.

Alternatively, as shown in FIG. 17, an electrical wire 90 along the peripheral edge of the swing plate 20 may be provided inside the swing plate 20, a magnet 92 may generate a magnetic field in a direction along the swing plate 20, and torque may be applied to the swing plate 20 by utilizing Lorentz force acting on the electrical wire 90 when a current source 94 flows a current on the electrical wire 90. When the drive mechanism 22 is configured as in FIG. 17, the biasing mechanism 24 is configured by the elastic members 60, 72, 74 as in FIG. 13, FIG. 14 and FIG. 15, a current supply path to the electrical wire 90 inside the swing plate 20 may be also formed inside the elastic members 60, 72, 74.

Figure 18:
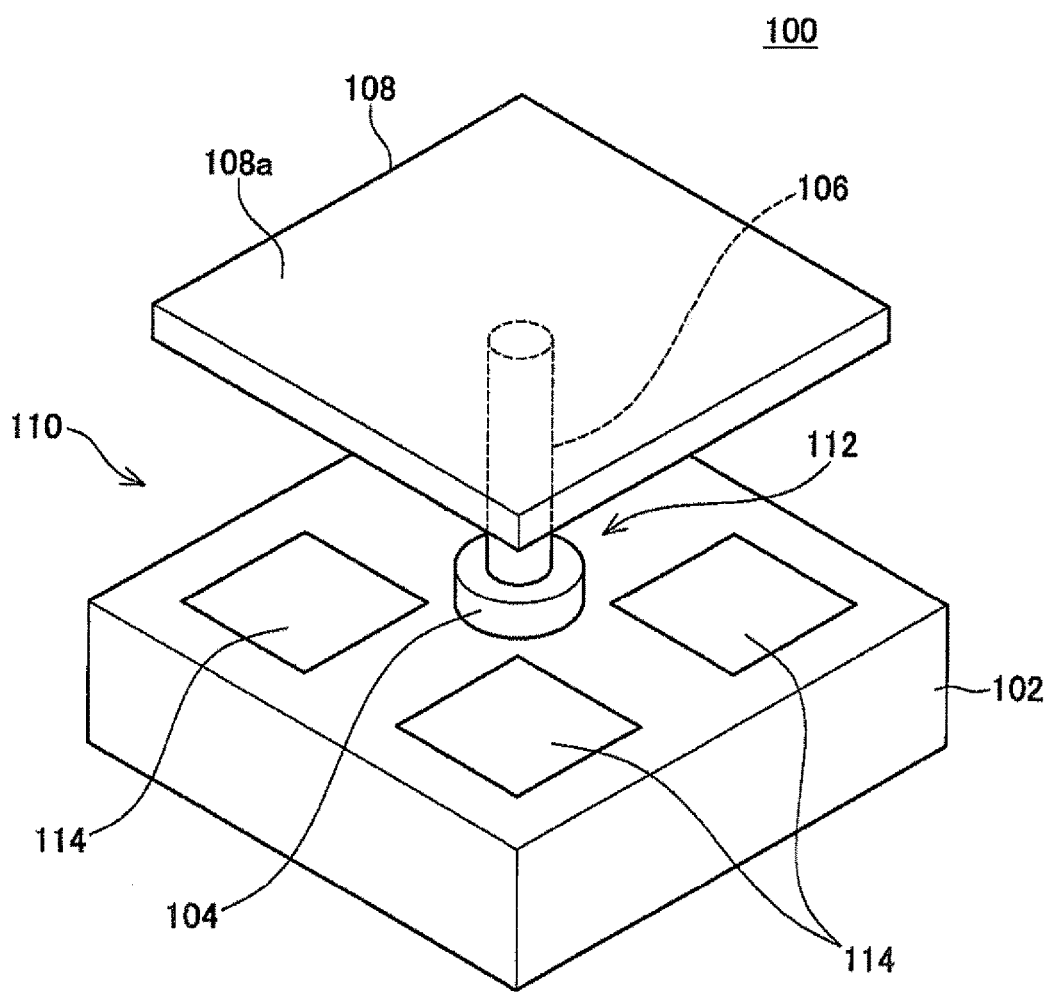
FIG. 18 is a perspective view showing a schematic configuration of a deflector 100 of an embodiment.

Hereinafter, a deflector 100 according to another embodiment will be described. FIG. 18 shows the deflector 100 of this embodiment. The deflector 100 mainly includes a substrate 102, a connecting member 104, a support member 106, a swing plate 108, a drive mechanism 110, and a biasing mechanism 112. A reflective film 108a reflecting incident light is formed on an upper surface of the swing plate 108. The deflector 100 swings the swing plate 108 with respect to the substrate 102, thereby changing a reflection angle of the incident light by the reflective film 108a.

The connecting member 104 is fixed to a center of an upper surface of the substrate 102. An upper end of the support member 106 is fixed to a center of a lower surface of the swing plate 108. The swing plate 108 is swingably placed in a state in which a lower end of the support member 106 abuts on the connecting member 104.

The drive mechanism 110 applies torque about a swing axis to the swing plate 108, thereby swinging the swing plate 108. A peripheral edge of the swing plate 108 abuts on the substrate 102, thereby defining a swing angle in swinging of the swing plate 108. In this embodiment, electrodes 114 formed on the substrate 102, and an electrode (not shown) formed on the swing plate 108 configure the drive mechanism 110. A voltage is applied between the electrodes 114 formed on the substrate 102, and the electrode formed on the swing plate 108, so that electrostatic force acts between both the electrodes, and torque about the swing axis is applied to the swing plate 108.

The biasing mechanism 112 biases the support member 106 toward the substrate 102, at least when force of separating the support member 106 from the substrate 102 acts. The biasing mechanism 112 can prevent the support member 106 from coming off the connecting member 104.

Figure 19:
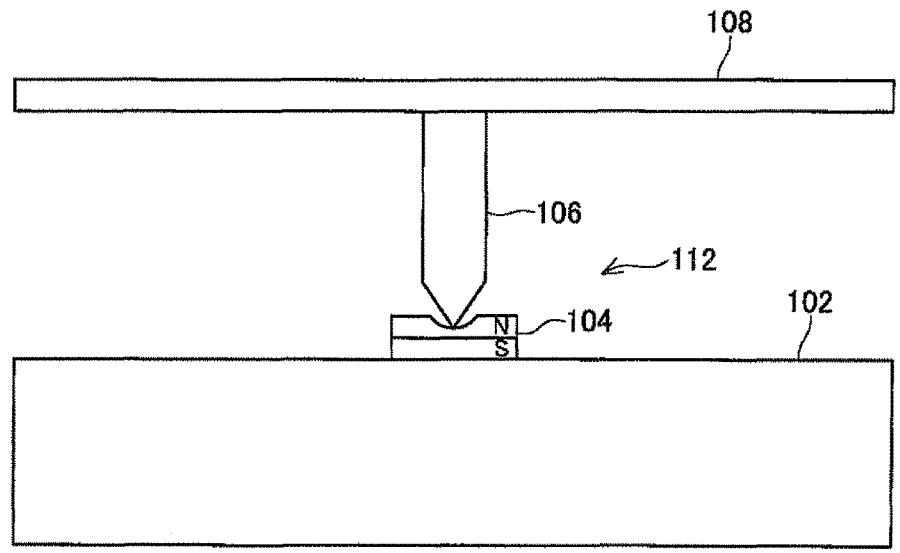
FIG. 19 is a side view showing an example of a configuration where a biasing mechanism 112 biases a support member 106 toward a substrate 102 by utilizing magnetic force.

In the deflector 100 of this embodiment, the support member 106 is biased toward the substrate 102 by using magnetic force, thereby implementing the biasing mechanism 112. As shown in FIG. 19, the support member 106 is formed by a magnetic material such as Ni. The connecting member 104 is formed by a magnet such as an electromagnet and a permanent magnet. The connecting member 104 is fixed to the substrate 102 by using, for example, an adhesive. A polar direction of the magnetic force of the connecting member 104 is arranged in a direction orthogonal to the substrate 102. A convex portion is formed on a tip of the support member 106, and a concave portion is formed on a center of the connecting member 104. The convex portion on the tip of the support member 106 abuts on the concave portion of the connecting member 104, so that the swing plate 108 is swingably supported by the substrate 102. With such a configuration, the support member 106 is always biased toward the substrate 102 by magnetic force acting between the support member 106 and the connecting member 104, and the support member 106 can be prevented from coming off the connecting member 104.

As long as the convex portion abuts on the concave portion of the connecting member 104, and can swingably support the swing plate 108, any shape of the convex portion on the tip of the support member 106 may be employed. For example, the convex portion may be formed in a triangular pyramid, or a hemisphere. As long as the concave portion of the connecting member 104 abuts on the convex portion on the tip of the support member 106, and the swing plate 108 can be swingably supported, the concave portion of the connecting member 104 may be formed in any shape.

The support member 106 may be entirely formed by a magnetic material such as Ni as described above, or the support member 106 may be formed by a non-magnetic material such as Al and only the tip part may be plated with a magnetic material such as Ni. As described above, the polar direction of the magnetic force of the connecting member 104 may be arranged in the direction orthogonal to the substrate 102, or may be arranged in a direction along substrate 102.

Figure 20:
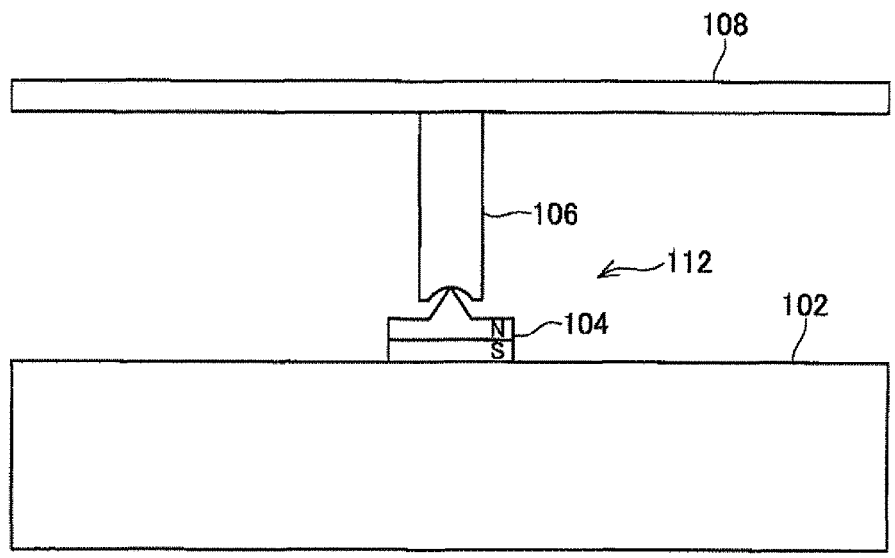
FIG. 20 is a side view showing another example of a configuration where the biasing mechanism 112 biases the support member 106 toward the substrate 102 by utilizing magnetic force.

As shown in FIG. 20, the convex portion may be formed on the connecting member 104, and the concave portion may be formed on the tip of the support member 106. Also in this case, the support member 106 may be entirely formed by a magnetic material, or the support member 106 may be entirely formed by a non-magnetic material and only the tip part may be plated by a magnetic material.

Figure 21:
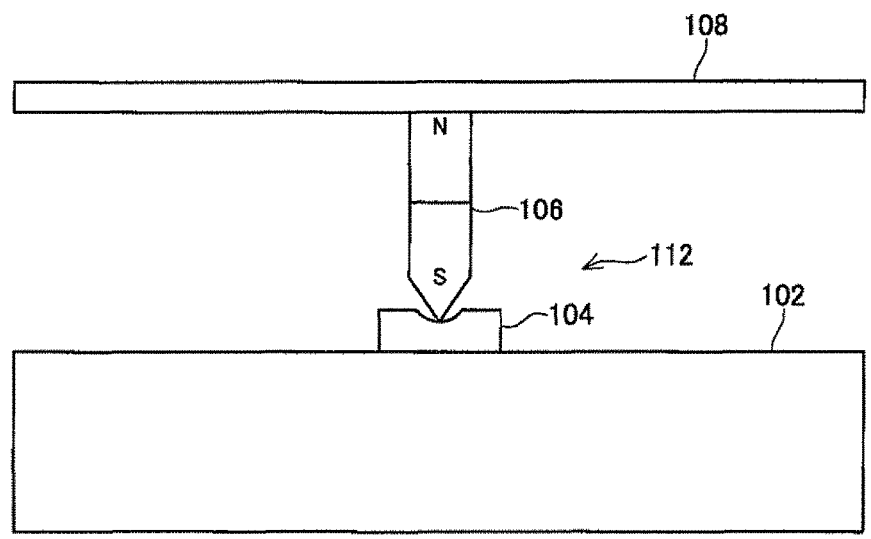
FIG. 21 is a side view showing another example of a configuration where the biasing mechanism 112 biases the support member 106 toward the substrate 102 by utilizing magnetic force.

As shown in FIG. 21, the support member 106 may be formed by a magnet such as an electromagnet and a permanent magnet, and the connecting member 104 may be formed by a magnetic material such as Ni. In this case, the connecting member 104 may be entirely formed by a magnetic material, or only a part, abutting on the support member 106, of the connecting member 104 may be plated by a magnetic material. In this case, the convex portion may be formed on the tip of the support member 106, and the concave portion may be formed on the connecting member 104. In this case, a magnet such as an electromagnet and a permanent magnet may be formed on the swing plate 108, in addition to the support member 106 abutting on the connecting member 104.

Although the biasing mechanism 112 biases the support member 106 toward the substrate 102 by magnetic force in the above description, the biasing mechanism 112 may bias the support member 106 toward the substrate 102 by utilizing other kind of force.

Figure 22:
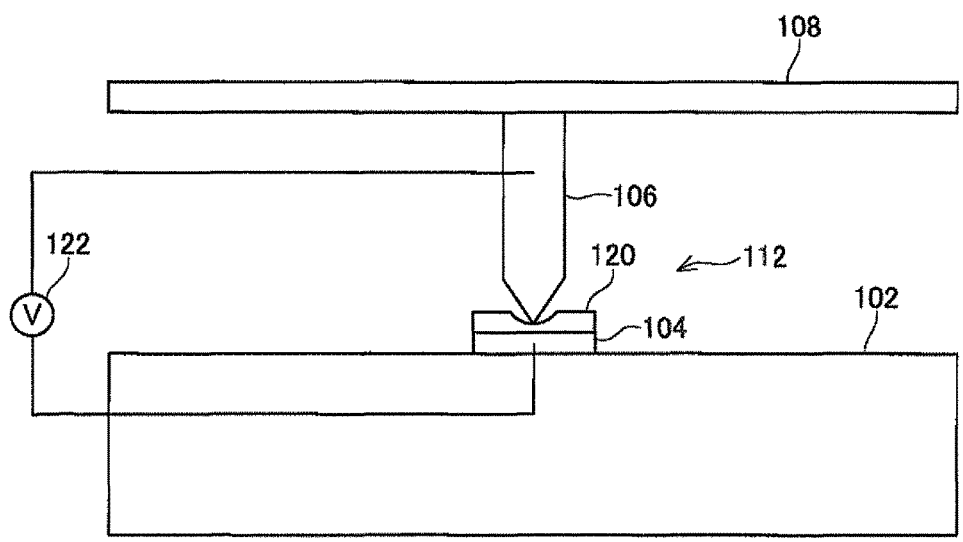
FIG. 22 is a side view showing an example of a configuration where the biasing mechanism 112 biases the support member 106 toward the substrate 102 by utilizing electrostatic force.

For example, as shown in FIG. 22, an insulator 120 is provided on the part, abutting on the support member 106, of the connecting member 104, a voltage applying mechanism 122 applies a voltage between the connecting member 104 and the support member 106, thereby also enabling the biasing mechanism 112 utilizing electrostatic force to be implemented. In this case, the support member 106 is always biased toward the substrate 102 by electrostatic force acting between the connecting member 104 and the support member 106. As long as conduction between the connecting member 104 and the support member 106 can be prevented, the insulator 120 may be arranged in any manner. For example, the insulator 120 may be provided on a part, abutting on the connecting member 104, of the support member 106, or may be provided on both of the connecting member 104 and the support member 106.

Figure 23:
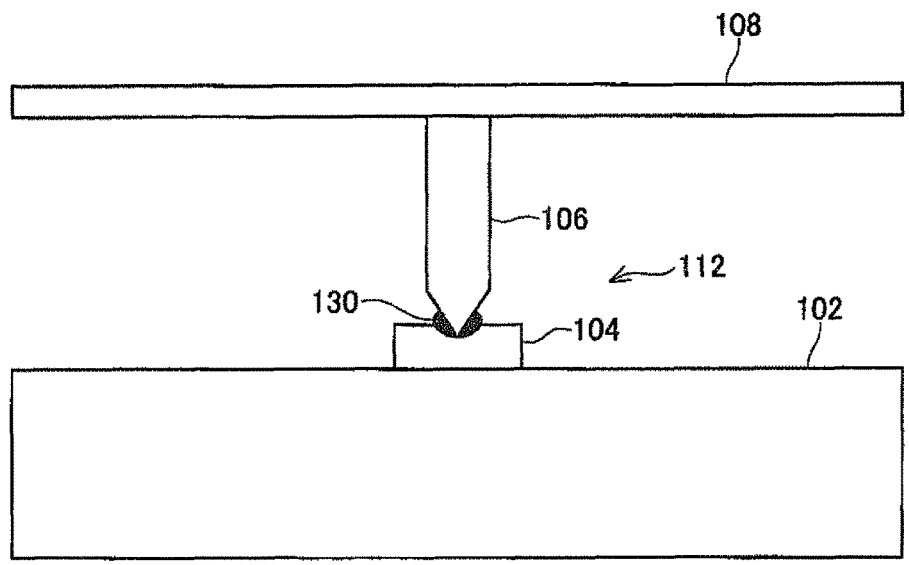
FIG. 23 is a side view showing an example of a configuration where the biasing mechanism 112 biases the support member 106 toward the substrate 102 by utilizing surface tension of non-volatile liquid 130.

Alternatively, as shown in FIG. 23, non-volatile liquid 130 is applied to abutting portions of the connecting member 104 and the support member 106, thereby also enabling the biasing mechanism 112 to be implemented. In this case, when force of separating the support member 106 from the substrate 102 acts, the support member 106 is biased toward the substrate 102 by surface tension of the non-volatile liquid 130, thereby enabling the support member 106 to be prevented from coming off the connecting member 104. In a case of the configuration shown in FIG. 23, portions, applied with the non-volatile liquid 130, of the connecting member 104 and/or the support member 106 may be subjected to lyophilic surface treatment. Particularly, in a case where the non-volatile liquid 130 is oil, the portions, applied with the non-volatile liquid 130, of the connecting member 104 and/or support member 106 may be subjected to lipophilic surface treatment. As the non-volatile liquid 130, for example, silicon oil or grease may be used.

Figure 24:
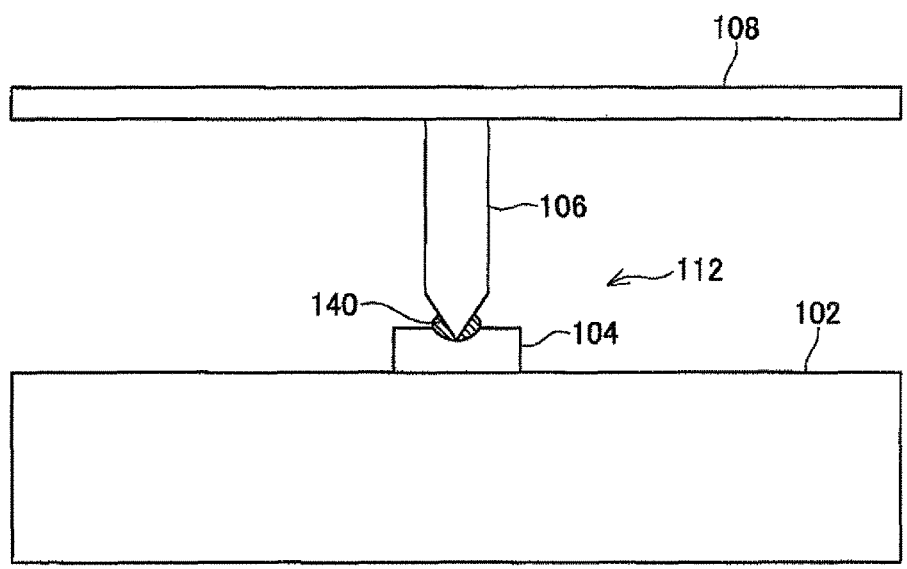
FIG. 24 is a side view showing an example of a configuration where the biasing mechanism 112 biases the support member 106 toward the substrate 102 by utilizing restoring force of a soft adhesive 140.

Alternatively, as shown in FIG. 24, the abutting portions of the connecting member 104 and the support member 106 are bonded together by a soft adhesive 140, thereby also enabling the biasing mechanism 112 to be implemented. In this case, when the force of separating the support member 106 from the substrate 102 acts, the support member 106 is biased toward the substrate 102 by restoring force of the soft adhesive 140, thereby enabling the support member 106 to be prevented from coming off the connecting member 104. As the soft adhesive 140, for example, an epoxy adhesive or silicon rubber may be used.

Figure 25:
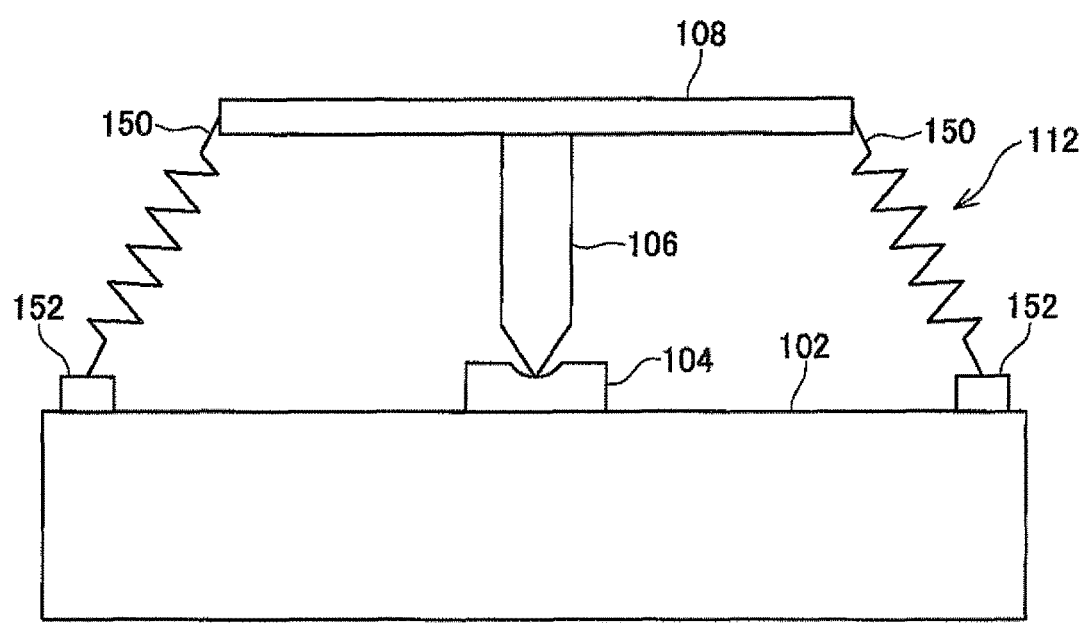
FIG. 25 is a side view showing an example of a configuration where the biasing mechanism 112 biases the support member 106 toward the substrate 102 by utilizing restoring force of elastic members 150.

Alternatively, as shown in FIG. 25, the swing plate 108 and the substrate 102 are connected to each other by using elastic members 150 having elasticity in a direction orthogonal to the swing plate 108 (vertical direction in FIG. 25), thereby also enabling the biasing mechanism 112 to be implemented. In an example shown in FIG. 25, the elastic members 150 connect between fixed members 152 fixed to the substrate 102, and the peripheral edge of the swing plate 108. In this case, when the force of separating the support member 106 from the substrate 102 acts, the support member 106 is biased toward the substrate 102 by restoring force of the elastic members 150, thereby enabling the support member 106 to be prevented from coming off the connecting member 104.

Although the drive mechanism 110 applies torque to the swing plate 108 by utilizing electrostatic force in the above description, the drive mechanism 110 may apply torque to the swing plate 108 by utilizing magnetic force in a manner similar to that described in FIG. 16, or may apply torque to the swing plate 108 by utilizing Lorentz force in a manner similar to that described in FIG. 17.

Figure 26:
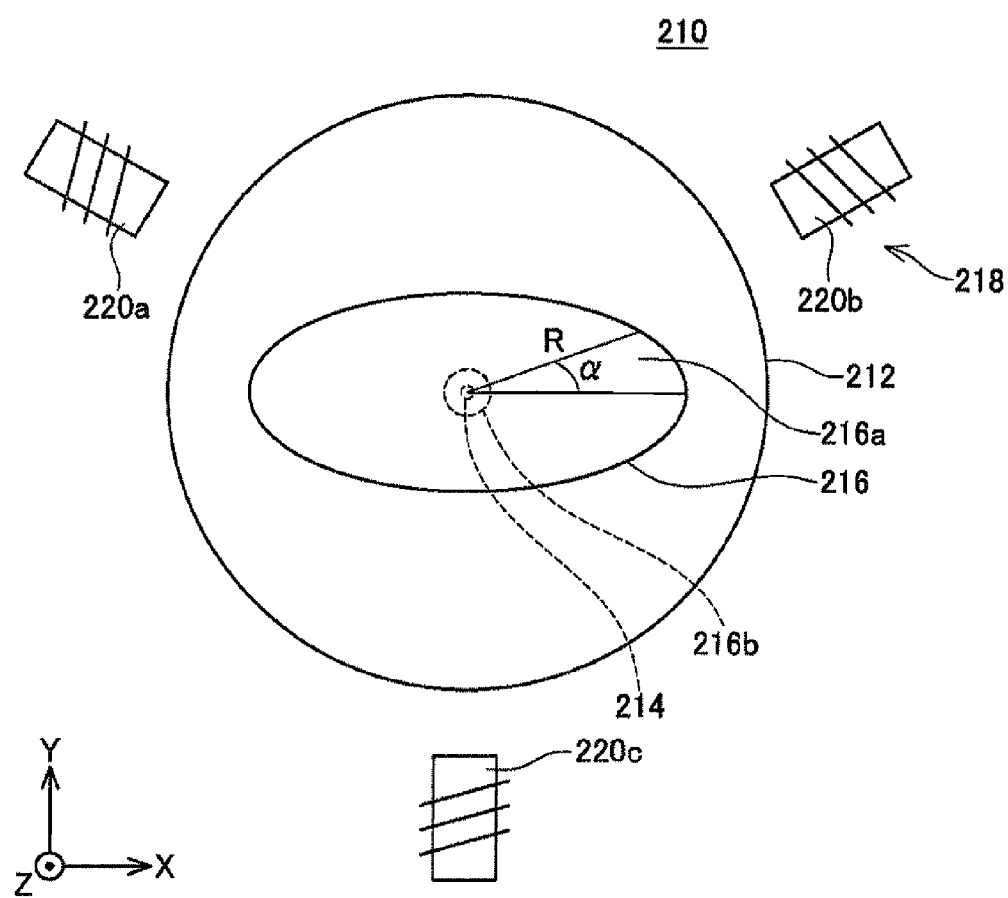
FIG. 26 is a top plan view showing a schematic configuration of a deflector 210 of an embodiment.

FIG. 26 shows a deflector 210 of another embodiment. The deflector 210 includes a substrate portion 212, a support column 214, a movable plate 216, and a drive mechanism 218. The substrate portion 212 is formed, for example, in a silicon wafer.

Figure 27:
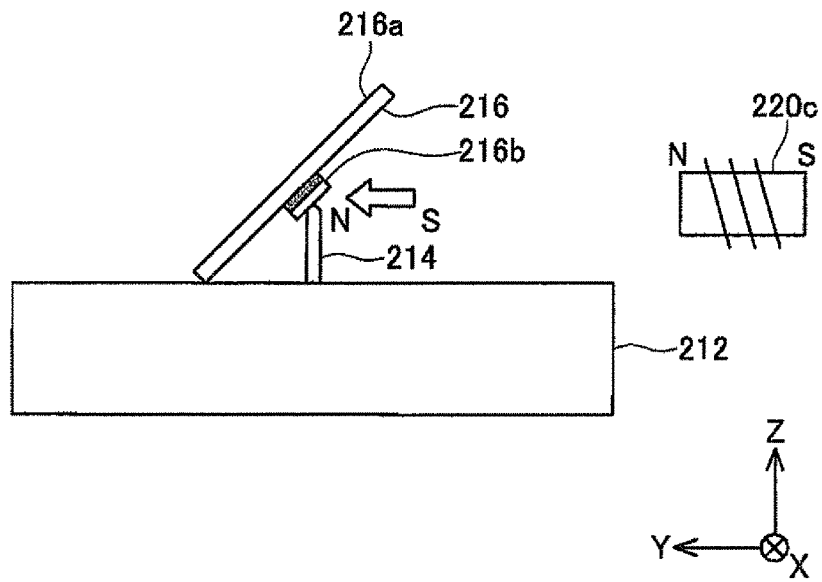
FIG. 27 is a side view showing an example of a state where an end in a minor axis direction of a movable plate 216 is in contact with a substrate portion 212.
Figure 28:
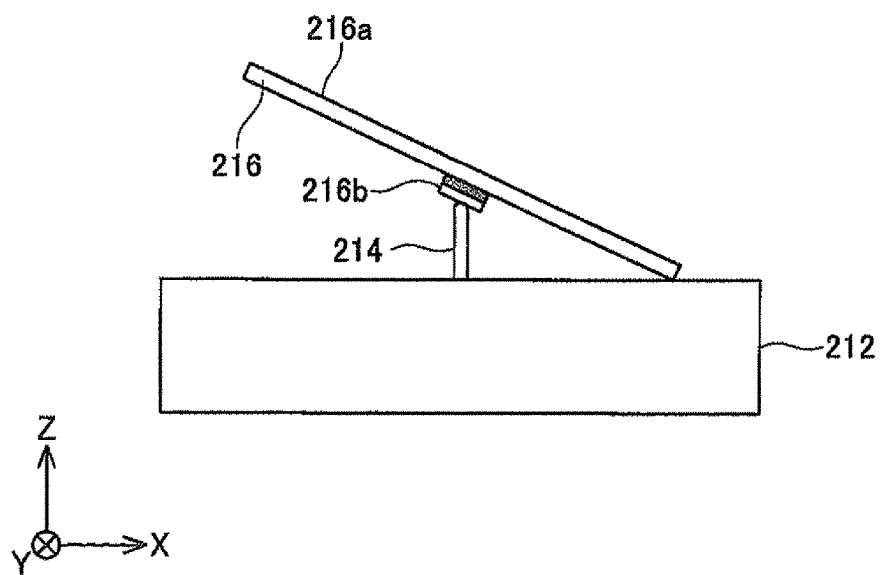
FIG. 28 is a side view showing an example of a state where an end in a major axis direction of the movable plate 216 is in contact with a substrate portion 212.

As shown in FIG. 27 or FIG. 28, the support column 214 has a lower end fixed to an upper surface of the substrate portion 212. An upper end of the support column 214 is rounded, and placed with the movable plate 216 thereon. As shown in FIG. 26, the movable plate 216 is formed in an oval flat plate shape. Hereinafter, a major axis direction of an oval of the movable plate 216 is defined as a pitch axis, a minor axis direction of the oval of the movable plate 216 is defined as a roll axis, and a direction orthogonal to the movable plate 216 is defined as a yaw axis. The movable plate 216 is formed, for example, from silicon. A reflective film 216a reflecting incident light is formed on an upper surface of the movable plate 216. The reflective film 216a is an evaporated film such as Al, for example.

The support column 214 is formed by a magnetic material. A permanent magnet 216b is provided on a part, abutting on the support column 214, of the movable plate 216. The permanent magnet 216b is arranged such that a polar direction of magnetic force is a direction orthogonal to the movable plate 216. In FIG. 27, a north pole of the permanent magnet 216b is hatched, and a south pole thereof is filled with white. The movable plate 216 is attracted to the support column 214 by the magnetic force of the permanent magnet 216b. The upper end of the support column 214 is rounded, and the movable plate 216 is swingable relative to the three axes. In other words, the movable plate 216 is supported at a support point provided on the upper end of the support column 214 so as to be swingable relative to the three axes of the pitch axis, the roll axis, and the yaw axis.

The support point described herein means a point which the swing axis passes when the movable plate 216 swings.

The drive mechanism 218 includes three electromagnets 220a, 220b, 220c, positions of which are fixed with respect to the substrate portion 212. The electromagnets 220a, 220b, 220c are arranges such that heights of centers thereof substantially coincide with a height of a center of the permanent magnet 216b of the movable plate 216. The electromagnets 220a, 220b, 220c are arranged such that polar directions of magnetic force thereof are along a plane parallel to the substrate portion 212, and have angles each different by $2\pi/3$. Intensity of the magnetic force generated by the electromagnets 220a, 220b, 220c is adjustable independently, a direction of magnetic force obtained by superimposing the magnetic force of the electromagnets 220a, 220b, 220c, which acts on the permanent magnet 216b, is adjustable to an arbitrary direction.

For example, when the drive mechanism 218 causes magnetic force in a direction Y (vertical direction in FIG. 26) to act with respect to the permanent magnet 216b of the movable plate 216, torque is applied to movable plate 216 so as to incline a polar direction of magnetic force of the permanent magnet 216b to the direction Y, and the movable plate 216 swings. Consequently, as shown in FIG. 27, one of ends in the minor axis direction of the movable plate 216 comes into contact with a surface of the substrate portion 212. Unlike in this case, when the drive mechanism 218 causes magnetic force in a direction X (horizontal direction in FIG. 26) to act, torque is applied to movable plate 216 so as to incline the polar direction of the magnetic force of the permanent magnet 216b in the direction X, and the movable plate 216 swings. Consequently, as shown in FIG. 28, one of ends in the major axis direction of the movable plate 216 comes into contact with the surface of the surface of the substrate portion 212. When the drive mechanism 218 causes a direction of the magnetic force acting on the permanent magnet 216b to rotate in a counterclockwise direction with respect to the substrate portion 212, the movable plate 216 rotates about the yaw axis such that a contact edge is brought into contact with the surface of the substrate portion 212.

FIG. 29 shows a relation between an azimuth angle $\theta$ of the contact point as viewed from the substrate portion 212, and an elevation angle $\phi$ of a reflective surface of the movable plate 216, in rotating the movable plate 216 about the yaw axis such that the contact edge is brought into contact with the surface of the substrate portion 212. Here, the azimuth angle $\theta$ indicates a rotation angle from an X-axis, the elevation angle $\phi$ indicates an inclination angle with respect to an XY plane (i.e., surface of the substrate portion 212). The movable plate 216 has a shape such that a distance from the support point to the contact edge in a direction orthogonal to the yaw axis changes according to a phase angle $\alpha$. Here, the phase angle $\alpha$ indicates a rotation angle from the pitch axis. Accordingly, the phase angle $\alpha$ of the contact point as viewed from the movable plate 216 also changes with change of the azimuth angle $\theta$ of the contact point as viewed from the substrate portion 212, resulting in change of the elevation angle $\phi$ of the reflective surface of the movable plate 216. A reflection angle of the deflector 210 is defined by the azimuth angle $\theta$ of the contact point as viewed from the substrate portion 212, and the elevation angle $\phi$ of the reflective surface of the movable plate 216.

Figure 30:
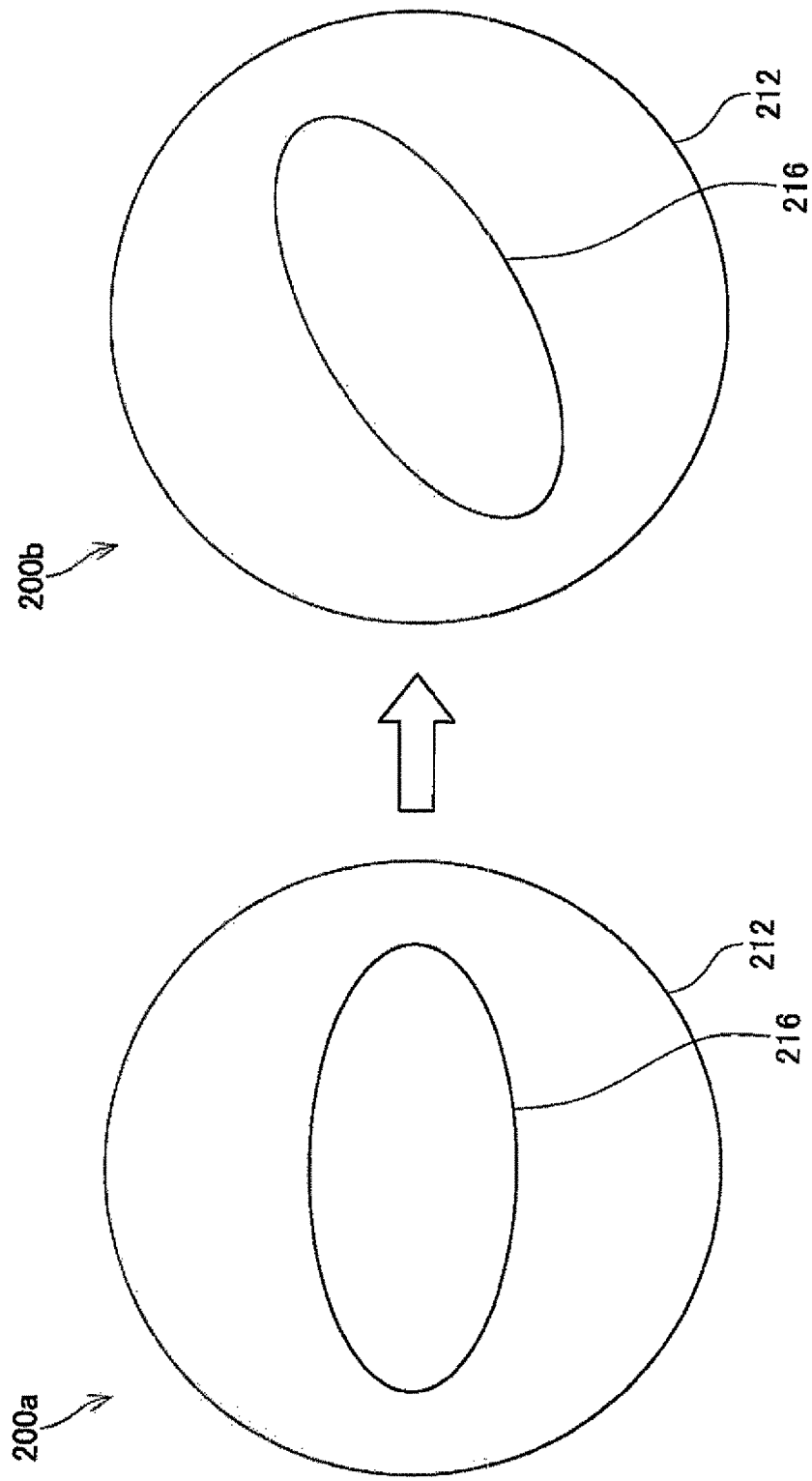
FIG. 30 is a figure showing an example of phase shifting between the substrate portion 212 and the movable plate 216 resulting from the movable plate 216 rotating once.

As shown in FIG. 30, in the deflector 210 of this embodiment, when the movable plate 216 rotates about the yaw axis once from a state 200a in which a reference point (e.g., one of ends in the major axis direction) of the movable plate 216 is in contact with the substrate portion 212, and is brought into a state 200b in which the reference point is contact with the substrate portion 212 again, a phase of the movable plate 216 is shifted by a prescribed angle δ with respect to the substrate portion 212. Reasons of this are as follows.

Figure 31:
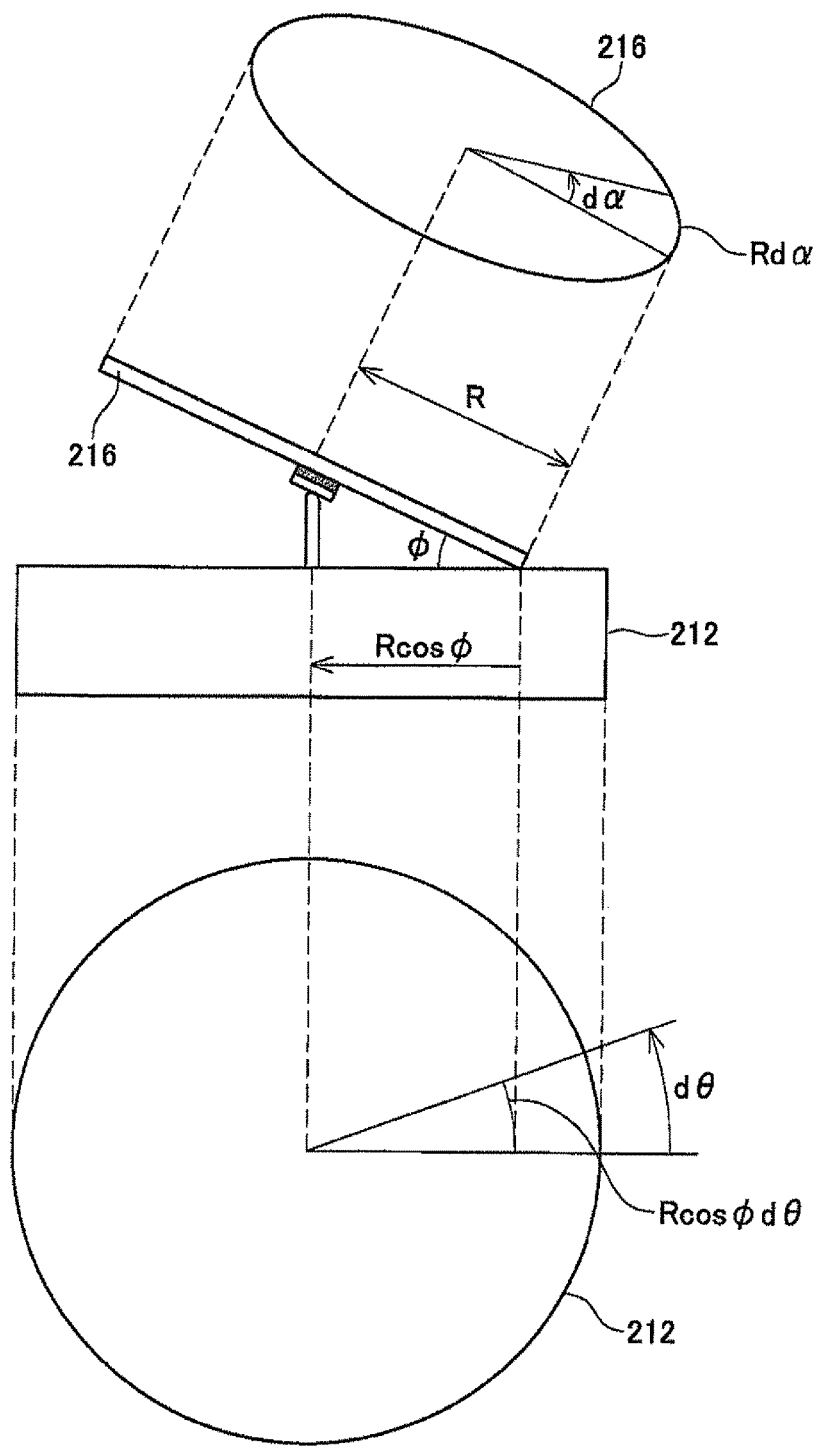
FIG. 31 is a figure of illustrating a principle of generation of phase shifting between the azimuth angle θ of the contact point as viewed from the substrate portion 212, and a phase angle α of the contact point as viewed from the movable plate 216.

As shown in FIG. 31, when the movable plate 216 rotates about the yaw axis such that the contact edge is brought into contact with the substrate portion 212, the azimuth angle θ of the contact point as viewed from the substrate portion 212 is changed by a infinitesimal angle dθ, and the phase angle α of the contact point as viewed from the movable plate 216 is changed by a infinitesimal angle dα, assuming that no slip occurs between the movable plate 216 and the substrate portion 212, the following formula holds from a geometric relation.

$$Rd\alpha = R \cos \phi d\theta$$

$$d\alpha = \cos \phi d\theta$$

Accordingly, assuming that an shift amount of an angle between the azimuth angle θ of the contact point as viewed from the substrate portion 212, and the phase angle α of the contact point as viewed from the movable plate 216 is phase shifting δ, the following relation is satisfied.

$$d\delta = d\theta - d\alpha = (1 - \cos \phi) d\theta$$

Accordingly, the phase shifting δ occurring during increase of the azimuth angle θ of the contact point as viewed from the substrate portion 212 by 2π is given by the following formula.

$$\delta = \int_0^{2\pi} (1 - \cos \phi) d\theta$$

Resulting from the above-described phase shifting δ between the azimuth angle θ and the phase angle α, a different elevation angle ϕ with respect to the same azimuth angle θ is implemented each time the movable plate 216 rotates once, as shown in FIG. 29. Consequently, the deflector 210 of this embodiment enables combination of an arbitrary azimuth angle θ and the elevation angle ϕ by repeatedly rotating the movable plate 216. The deflector 210 of this embodiment enables scanning in two directions, i.e., a direction of longitude and a direction of latitude.

As the shape as viewed on a plane orthogonal to the yaw axis of the movable plate 216, various shapes other than the above-described oval may be employed.

Figure 32:
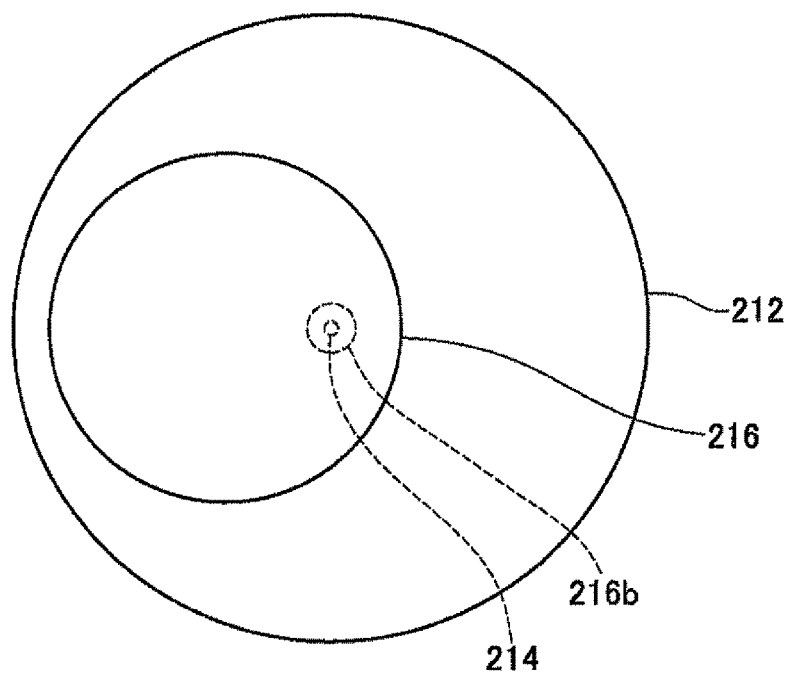
FIG. 32 is a top plan view showing an example of another aspect of the movable plate 216.

For example, as shown in FIG. 32, the movable plate 216 may be formed in a circle. In this case, a position of a center of the circle is arranged at a position offset from the support point. Also in this case, the movable plate 216 has a shape such that a distance R from the support point to the contact edge changes according to the phase angle α, thereby enabling scanning in two directions of the azimuth angle θ and the elevation angle ϕ.

Figure 33:
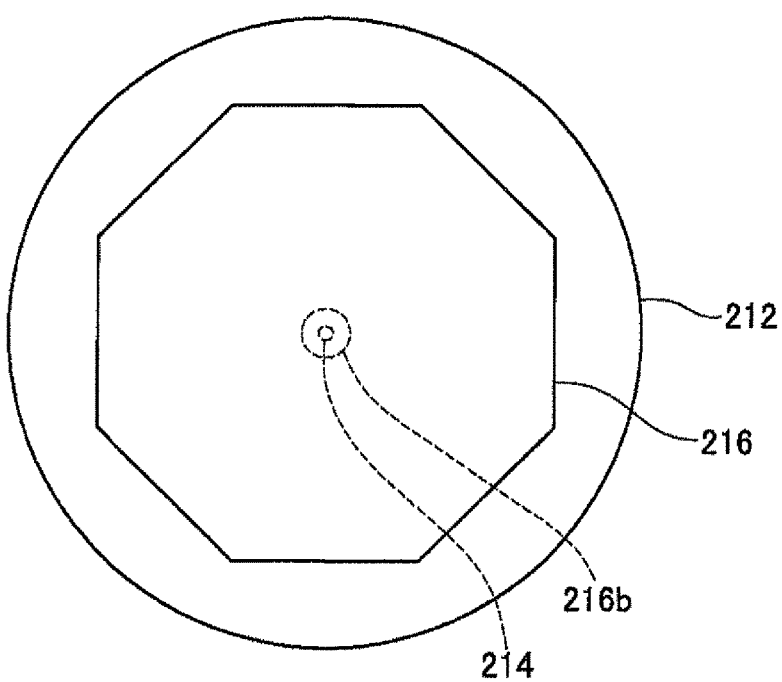
FIG. 33 is a top plan view showing an example of another aspect of the movable plate 216.
Figure 34:
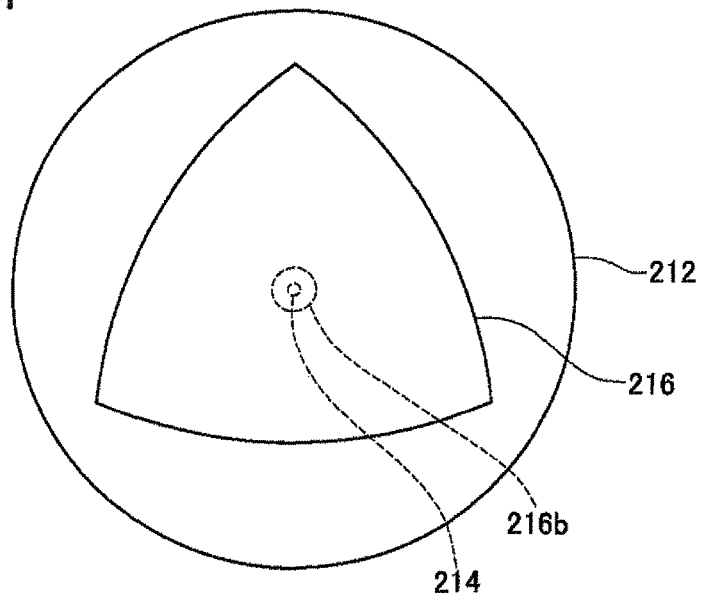
FIG. 34 is a top plan view showing an example of another aspect of the movable plate 216.

Alternatively, as shown in FIG. 33, the movable plate 216 may be formed in a polygon. Alternatively, as shown in FIG. 34, the movable plate 216 may be formed in a Reuleau polygonal shape. Alternatively, the movable plate 216 may be formed in a heart shape, a star shape, or the like. Also in this case, the movable plate 216 has a shape such that a distance from the support point to the contact edge changes according to the phase angle, thereby enabling scanning in the two directions of the azimuth angle θ and the elevation angle ϕ.

Figure 35:
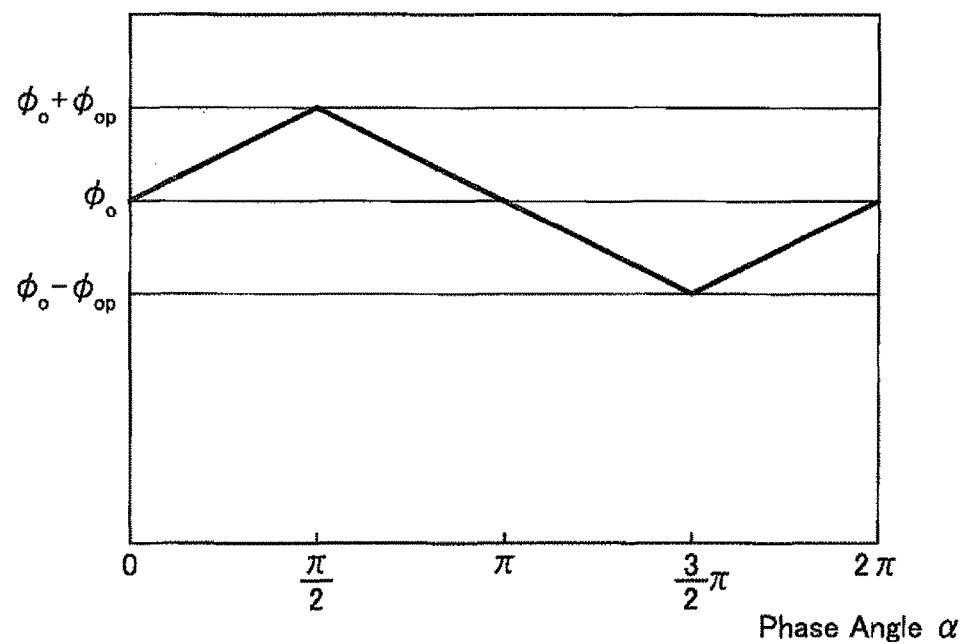
FIG. 35 is a figure showing an example of a variation pattern of the elevation angle φ with respect to the phase angle α.

Alternatively, a shape of the contact edge of the movable plate 216 may be determined such that the change of the elevation angle ϕ according to the azimuth angle θ becomes a desired pattern. For example, as shown in FIG. 35, the shape of the contact edge of the movable plate 216 may be determined such that the elevation angle ϕ changes in a triangular waveform. In this case, the contact edge of the movable plate 216 is formed in a shape satisfying the following.

$$R(\alpha) = \frac{L}{\sin\left(\frac{2}{\pi}\phi_{op}\alpha + \phi_o\right)} \text{ for } 0 \leq \alpha < \frac{\pi}{2}$$

$$R(\alpha) = \frac{L}{\sin\left(\frac{2}{\pi}\phi_{op}(\pi - \alpha) + \phi_o\right)} \text{ for } \frac{\pi}{2} \leq \alpha < \frac{3\pi}{2}$$

$$R(\alpha) = \frac{L}{\sin\left(\frac{2}{\pi}\phi_{op}(\alpha - 2\pi) + \phi_o\right)} \text{ for } \frac{3}{2}\pi \leq \alpha < 2\pi$$

Here, L denotes a height from the surface of the substrate portion 212 to the support point, $\phi_o$ denotes a central value of the elevation angle, and $\phi_{op}$ denotes amplitude of the elevation angle.

In a case where the elevation angle ϕ is changed in a triangular waveform shown in FIG. 36, the contact edge of the movable plate 216 is formed in the following shape.

$$R(\alpha) = \frac{L}{\sin\left(\frac{4}{\pi}\phi_{op}\alpha + \phi_o\right)} \text{ for } 0 \leq \alpha < \frac{\pi}{4}$$

$$R(\alpha) = \frac{L}{\sin\left(\frac{4}{\pi}\phi_{op}\left(\frac{\pi}{2} - \alpha\right) + \phi_o\right)} \text{ for } \frac{\pi}{4} \leq \alpha < \frac{3\pi}{4}$$

$$R(\alpha) = \frac{L}{\sin\left(\frac{4}{\pi}\phi_{op}(\alpha - \pi) + \phi_o\right)} \text{ for } \frac{3\pi}{2} \leq \alpha < \frac{5\pi}{4}$$

$$R(\alpha) = \frac{L}{\sin\left(\frac{4}{\pi}\phi_{op}\left(\frac{3\pi}{2} - \alpha\right) + \phi_o\right)} \text{ for } \frac{5\pi}{4} \leq \alpha < \frac{7\pi}{4}$$

$$R(\alpha) = \frac{L}{\sin\left(\frac{4}{\pi}\phi_{op}(\alpha - 2\pi) + \phi_o\right)} \text{ for } \frac{7\pi}{4} \leq \alpha < 2\pi$$

In a case where the elevation angle ϕ is changed in a triangular waveform shown in FIG. 37, the contact edge of the movable plate 216 is formed in the following shape.

$$R(\alpha) = \frac{L}{\sin\left(\frac{6}{\pi}\phi_{op}\alpha + \phi_o\right)} \text{ for } 0 \leq \alpha < \frac{\pi}{6}$$

$$R(\alpha) = \frac{L}{\sin\left(\frac{6}{\pi}\phi_{op}\left(\frac{\pi}{3} - \alpha\right) + \phi_o\right)} \text{ for } \frac{\pi}{6} \leq \alpha < \frac{\pi}{2}$$

$$R(\alpha) = \frac{L}{\sin\left(\frac{6}{\pi}\phi_{op}\left(\alpha - \frac{2\pi}{3}\right) + \phi_o\right)} \text{ for } \frac{\pi}{2} \leq \alpha < \frac{5\pi}{6}$$

$$R(\alpha) = \frac{L}{\sin\left(\frac{6}{\pi}\phi_{op}(\pi - \alpha) + \phi_o\right)} \text{ for } \frac{5\pi}{6} \leq \alpha < \frac{7\pi}{6}$$

$$R(\alpha) = \frac{L}{\sin\left(\frac{6}{\pi}\phi_{op}\left(\alpha - \frac{4\pi}{3}\right) + \phi_o\right)} \text{ for } \frac{7\pi}{6} \leq \alpha < \frac{3\pi}{2}$$

-continued $$R(\alpha) = \frac{L}{\sin\left(\frac{6}{\pi}\phi_{op}\left(\frac{5\pi}{3} - \alpha\right) + \phi_o\right)} \text{ for } \frac{3\pi}{2} \leq \alpha < \frac{11\pi}{6}$$

$$R(\alpha) = \frac{L}{\sin\left(\frac{6}{\pi}\phi_{op}(\alpha - 2\pi) + \phi_o\right)} \text{ for } \frac{11\pi}{6} \leq \alpha < 2\pi$$

Figure 38:
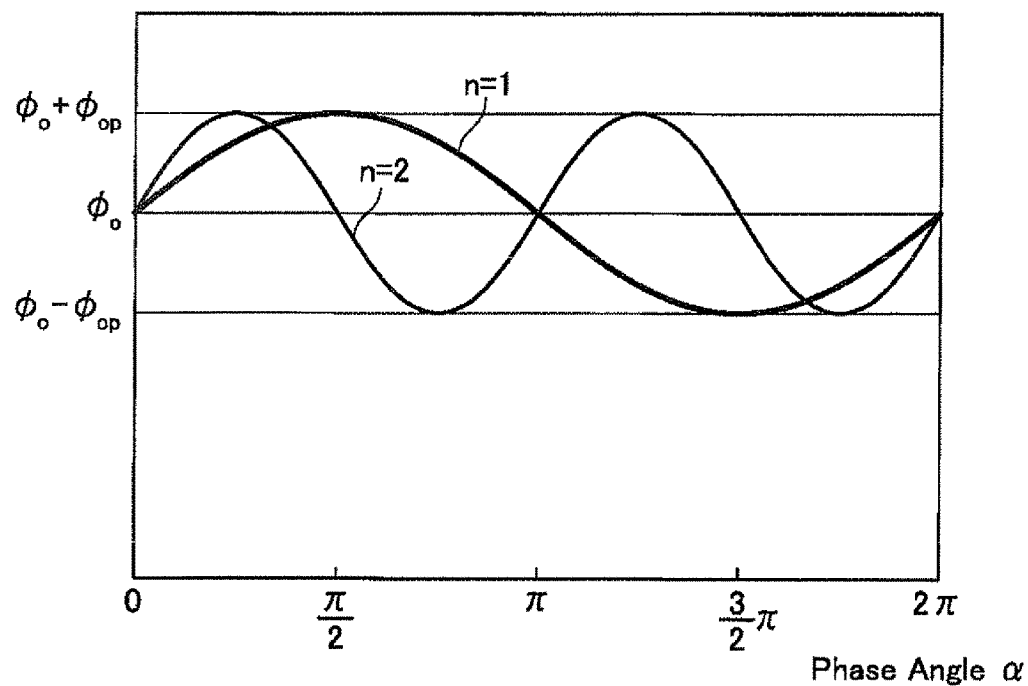
FIG. 38 is a figure showing another example of the variation pattern of the elevation angle φ with respect to the phase angle α.

Alternatively, as shown in FIG. 38, the shape of the contact edge of the movable plate 216 may be determined such that the elevation angle ϕ is changed in a sine wave. In this case, the contact edge of the movable plate 216 is formed in a shape satisfying the following.

$$R(\alpha) = \frac{L}{\sin(\phi_{op}\sin n\alpha + \phi_o)}$$

Here, n denotes the number of cycles.

Figure 39:
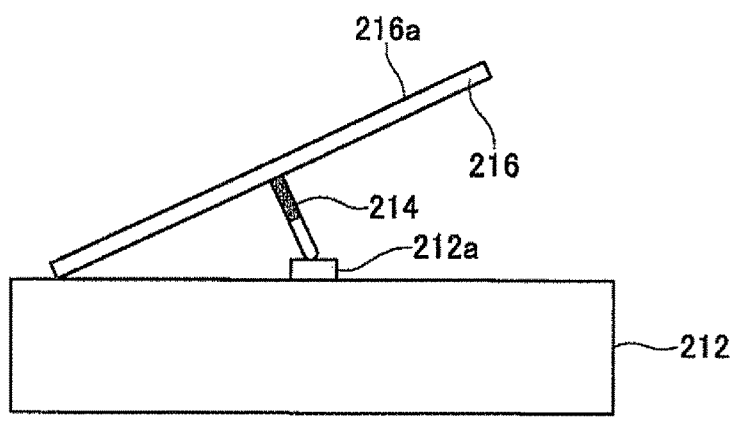
FIG. 39 is a side view showing another aspect of the deflector 210 of the embodiment.

The support column 214 is fixed to the substrate portion 212, the movable plate 216 is swingably supported on the upper end of the support column 214. However, unlike in this case, as shown in FIG. 39, the support column 214 may be fixed to the movable plate 216, and the support column 214 and the movable plate 216 may be swingably supported on the lower end of the support column 214 by the substrate portion 212. In an example shown in FIG. 39, a support base 212a formed by a magnetic material is formed on the upper surface of the substrate portion 212, and the lower end of the support column 214 formed by a permanent magnet is placed so as to be in contact with the support base 212a. The lower end of the support column 214 is rounded, and hence the support column 214 and the movable plate 216 are supported at the support point located on the lower end of the support column 214 so as to be swingable relative to the three axes of the pitch axis, the roll axis, and the yaw axis. With such a configuration, the combination of an arbitrary azimuth angle θ and the elevation angle ϕ can be implemented by repeatedly rotating the movable plate 216, and scanning in two directions of a direction of longitude and a direction of latitude is enabled.

Although the drive mechanism 218 rotates and drives the movable plate 216 about the yaw axis such that the contact edge of the movable plate 216 is brought into contact with the surface of the substrate portion 212, by utilizing magnetic force in the above-described embodiment, various configuration of the drive mechanism 218 other than the above may be used. For example, an electrode is formed inside the movable plate 216, a plurality of electrodes covered with insulating films is arranged on the upper surface of the substrate portion 212 in a prescribed pattern, and a voltage is selectively applied between the electrode of the movable plate 216 and the electrodes of the substrate portion 212, thereby enabling the drive mechanism 218 utilizing the electrostatic force to be implemented. In this case, when a voltage is applied between a specified electrode of the substrate portion 212 and the electrode of the movable plate 216, torque is applied to the movable plate 216 such that an end of the movable plate 216 above the specified electrode approaches the specified electrode of the substrate portion 212 by electrostatic force, and the contact edge of the movable plate 216 comes into contact with the surface of the substrate portion 212. The electrodes of the substrate portion 212, which a voltage is applied between the electrode of the movable plate 216 and, are successively changed, so that the movable plate 216 can rotate about the yaw axis such that the contact edge of the movable plate 216 is brought into contact with the surface of the substrate portion 212.

In the above-described embodiment, the permanent magnet 216b is provided on the lower surface of the movable plate 216, the support column 214 is formed by a magnetic material, and the upper end of the support column 214 is rounded, and the movable plate 216 is supported to be swingable relative to the three axes of the pitch axis, the roll axis, and the yaw axis. However, various supporting aspects of the movable plate 216 other than the above may be employed. For example, a protruding portion having a spherical tip may be provided on the lower surface of the movable plate 216, an engagement portion slidably engaged with the protruding portion may be provided on the upper end of the support column 214, and the movable plate 216 may be supported so as to be swingable relative to the relative to the three axes of the pitch axis, the roll axis, and the yaw axis by the engagement of the protruding portion and the engagement portion.

Figure 40:
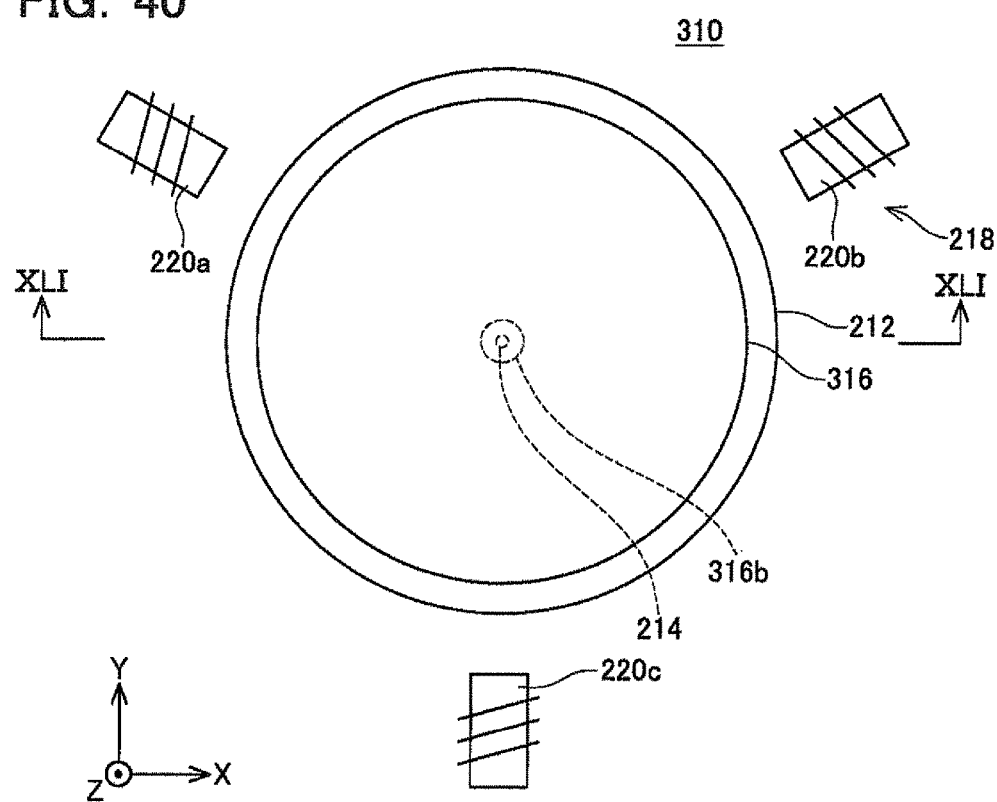
FIG. 40 is a top plan view showing a schematic configuration of a deflector 310 of an embodiment.

FIG. 40 shows a deflector 310 of another embodiment. Hereinafter, configurations similar to those of the deflector 210 of the above-described embodiment are denoted with the same reference numerals, and detailed description thereof will be omitted. The deflector 310 includes a substrate portion 212, a support column 214, a movable portion 316, and a drive mechanism 218.

Figure 41:
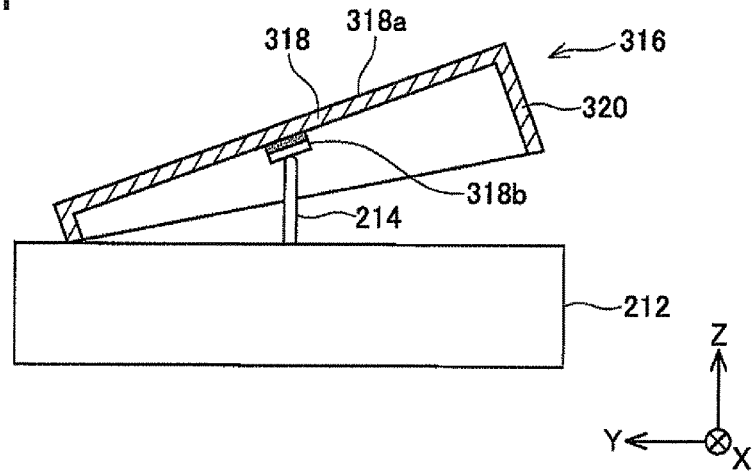
FIG. 41 is a longitudinal sectional taken along XLI-XLI in FIG. 40.

As shown in FIG. 41, the movable portion 316 has a circular flat plate portion 318, and a skirt portion 320 formed on a peripheral edge of the flat plate portion 318. A reflective film 318a reflecting incident light is formed on an upper surface of the flat plate portion 318. The reflective film 318a is an evaporated film such as Al. A permanent magnet 318b abutting on the support column 214 of the magnetic material is provided on a lower surface of the flat plate portion 318. In this embodiment, directions parallel to the flat plate portion 318 is defined as a pitch axis and a roll axis, and a direction orthogonal to the flat plate portion 318 is defined as a yaw axis.

The skirt portion 320 extends in the direction orthogonal to the flat plate portion 318. When the movable portion 316 swings, a lower end of the skirt portion 320 comes into contact with the surface of the substrate portion 212 as a contact edge of the movable portion 316. As shown in FIG. 41, a height of the skirt portion 320 changes according to a phase angle α. Accordingly, the movable portion 316 of this embodiment has a shape such that a distance from the support point to the contact changes according to the phase angle α.

Also in the deflector 310 of this embodiment, phase shifting δ exists between an azimuth angle θ of a contact point as viewed from the substrate portion 212, and the phase angle α of the contact point as viewed from the movable portion 316, thereby implementing a different elevation angle ϕ with respect to the same azimuth angle θ each time the movable portion 316 rotates once. Consequently, the deflector 310 of this embodiment enables combination of an arbitrary azimuth angle θ and the elevation angle ϕ by repeatedly rotating the movable portion 316, and enables scanning in two directions of a direction of longitude and a direction of latitude.

As long as a height of the skirt portion 320 changes according to the phase angle α, various shapes may be employed as a shape of the skirt portion 320.

For example, in a case where the elevation angle ϕ is changed in a triangular waveform shown in FIG. 35, a shape of the movable portion 316 is determined such that a height t of the skirt portion 320 satisfies the following.

$$t(\alpha) = T + \frac{L - R\sin\left(\frac{2}{\pi}\phi_{op}\alpha + \phi_o\right)}{\cos\left(\frac{2}{\pi}\phi_{op}\alpha + \phi_o\right)} \text{ for } 0 \leq \alpha < \frac{\pi}{2}$$

$$t(\alpha) = T + \frac{L - R\sin\left(\frac{2}{\pi}\phi_{op}(\pi - \alpha) + \phi_o\right)}{\cos\left(\frac{2}{\pi}\phi_{op}(\pi - \alpha) + \phi_o\right)} \text{ for } \frac{\pi}{2} \leq \alpha < \frac{3\pi}{2}$$

$$t(\alpha) = T + \frac{L - R\sin\left(\frac{2}{\pi}\phi_{op}(\alpha - 2\pi) + \phi_o\right)}{\cos\left(\frac{2}{\pi}\phi_{op}(\alpha - 2\pi) + \phi_o\right)} \text{ for } \frac{3\pi}{2} \leq \alpha < 2\pi$$

Here, T denotes a thickness of the flat plate portion 318, L denotes a height from the surface of the substrate portion 212 from the support point $\phi_o$ denotes a central value of the elevation angle, and $\phi_{op}$ denotes amplitude of the elevation angle.

Figure 36:
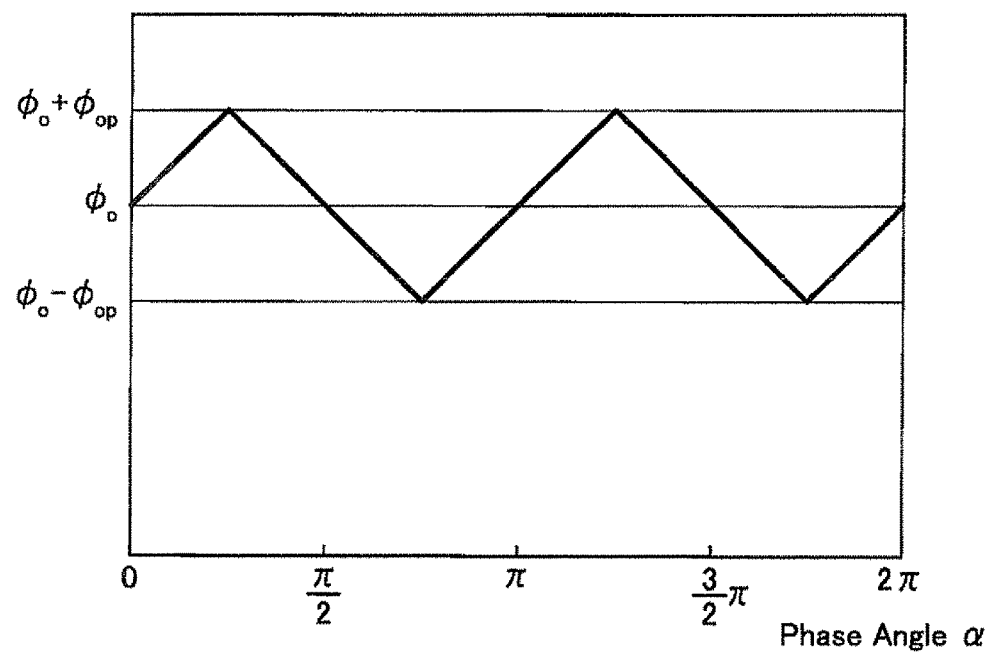
FIG. 36 is a figure showing another example of the variation pattern of the elevation angle φ with respect to the phase angle α.

In a case where the elevation angle φ is changed in a triangular waveform shown in FIG. 36, the shape of the movable portion 316 is determined such that the height of the skirt portion 320 satisfies the following.

$$t(\alpha) = T + \frac{L - R\sin\left(\frac{4}{\pi}\phi_{op}\alpha + \phi_o\right)}{\cos\left(\frac{4}{\pi}\phi_{op}\alpha + \phi_o\right)} \text{ for } 0 \leq \alpha < \frac{\pi}{4}$$

$$t(\alpha) = T + \frac{L - R\sin\left(\frac{4}{\pi}\phi_{op}\left(\frac{\pi}{2} - \alpha\right) + \phi_o\right)}{\cos\left(\frac{4}{\pi}\phi_{op}\left(\frac{\pi}{2} - \alpha\right) + \phi_o\right)} \text{ for } \frac{\pi}{4} \leq \alpha < \frac{3\pi}{4}$$

$$t(\alpha) = T + \frac{L - R\sin\left(\frac{4}{\pi}\phi_{op}(\alpha - \pi) + \phi_o\right)}{\cos\left(\frac{4}{\pi}\phi_{op}(\alpha - \pi) + \phi_o\right)} \text{ for } \frac{3\pi}{4} \leq \alpha < \frac{5\pi}{4}$$

$$t(\alpha) = T + \frac{L - R\sin\left(\frac{4}{\pi}\phi_{op}\left(\frac{3\pi}{2} - \alpha\right) + \phi_o\right)}{\cos\left(\frac{4}{\pi}\phi_{op}\left(\frac{3\pi}{2} - \alpha\right) + \phi_o\right)} \text{ for } \frac{5\pi}{4} \leq \alpha < \frac{7\pi}{4}$$

$$t(\alpha) = T + \frac{L - R\sin\left(\frac{4}{\pi}\phi_{op}(\alpha - 2\pi) + \phi_o\right)}{\cos\left(\frac{4}{\pi}\phi_{op}(\alpha - 2\pi) + \phi_o\right)} \text{ for } \frac{7\pi}{4} \leq \alpha < 2\pi$$

Figure 37:
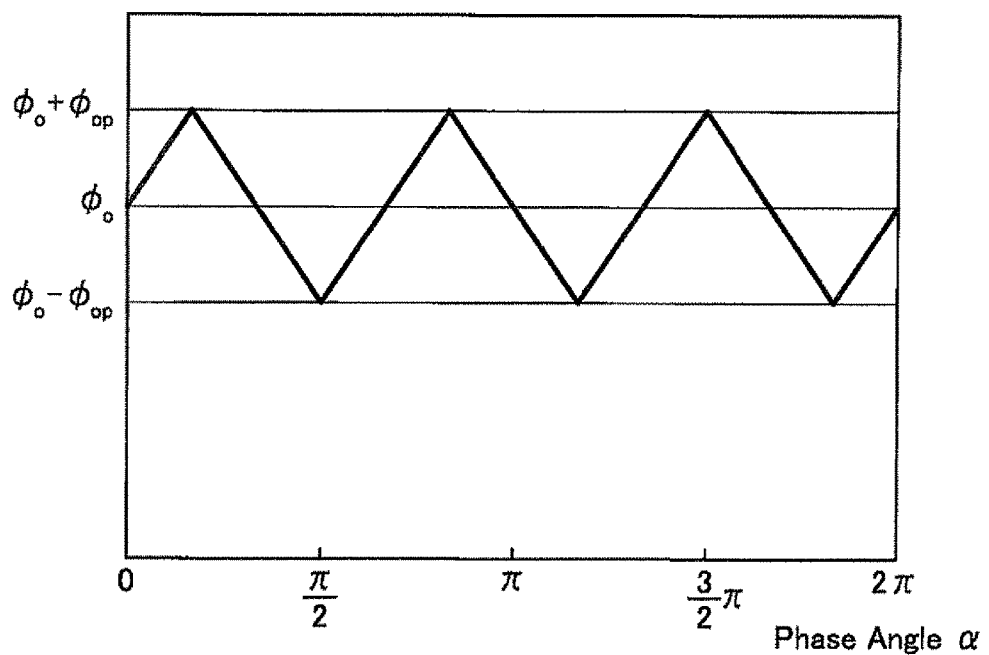
FIG. 37 is a figure showing another example of the variation pattern of the elevation angle φ with respect to the phase angle α.

In a case where the elevation angle φ is changed in a triangular waveform shown in FIG. 37, the shape of the movable portion 316 is determined such that the height t of the skirt portion 320 satisfies the following.

$$t(\alpha) = T + \frac{L - R\sin\left(\frac{6}{\pi}\phi_{op}\alpha + \phi_o\right)}{\cos\left(\frac{6}{\pi}\phi_{op}\alpha + \phi_o\right)} \text{ for } 0 \leq \alpha < \frac{\pi}{6}$$

$$t(\alpha) = T + \frac{L - R\sin\left(\frac{6}{\pi}\phi_{op}\left(\frac{\pi}{3} - \alpha\right) + \phi_o\right)}{\cos\left(\frac{6}{\pi}\phi_{op}\left(\frac{\pi}{3} - \alpha\right) + \phi_o\right)} \text{ for } \frac{\pi}{6} \leq \alpha < \frac{\pi}{2}$$

$$t(\alpha) = T + \frac{L - R\sin\left(\frac{6}{\pi}\phi_{op}\left(\alpha - \frac{2\pi}{3}\right) + \phi_o\right)}{\cos\left(\frac{6}{\pi}\phi_{op}\left(\alpha - \frac{2\pi}{3}\right) + \phi_o\right)} \text{ for } \frac{\pi}{2} \leq \alpha < \frac{5\pi}{6}$$

$$t(\alpha) = T + \frac{L - R\sin\left(\frac{6}{\pi}\phi_{op}(\pi - \alpha) + \phi_o\right)}{\cos\left(\frac{6}{\pi}\phi_{op}(\pi - \alpha) + \phi_o\right)} \text{ for } \frac{5\pi}{6} \leq \alpha < \frac{7\pi}{6}$$

$$t(\alpha) = T + \frac{L - R\sin\left(\frac{6}{\pi}\phi_{op}\left(\alpha - \frac{4\pi}{3}\right) + \phi_o\right)}{\cos\left(\frac{6}{\pi}\phi_{op}\left(\alpha - \frac{4\pi}{3}\right) + \phi_o\right)} \text{ for } \frac{7\pi}{6} \leq \alpha < \frac{3\pi}{2}$$

$$t(\alpha) = T + \frac{L - R\sin\left(\frac{6}{\pi}\phi_{op}\left(\frac{5\pi}{3} - \alpha\right) + \phi_o\right)}{\cos\left(\frac{6}{\pi}\phi_{op}\left(\frac{5\pi}{3} - \alpha\right) + \phi_o\right)} \text{ for } \frac{3\pi}{2} \leq \alpha < \frac{11\pi}{6}$$

$$t(\alpha) = T + \frac{L - R\sin\left(\frac{6}{\pi}\phi_{op}(\alpha - 2\pi) + \phi_o\right)}{\cos\left(\frac{6}{\pi}\phi_{op}(\alpha - 2\pi) + \phi_o\right)} \text{ for } \frac{11\pi}{6} \leq \alpha < 2\pi$$

Alternatively, as shown in FIG. 38, the shape of the movable portion 316 may be determined such that the elevation angle φ is changed in a sine wave. In this case, the shape of the movable portion 316 is determined such that the height t of the skirt portion 320 satisfies the following.

$$t(\alpha) = T + \frac{L - R\sin(\phi_{op}\sin n\alpha + \phi_o)}{\cos(\phi_{op}\sin n\alpha + \phi_o)}$$

Here, n denotes the number of cycles.

In this embodiment, as the shape of the flat plate portion 318, various shapes may be employed. For example, the shape of the flat plate portion 318 may be an oval similar to that of the movable plate 216 of FIG. 26.

Figure 42:
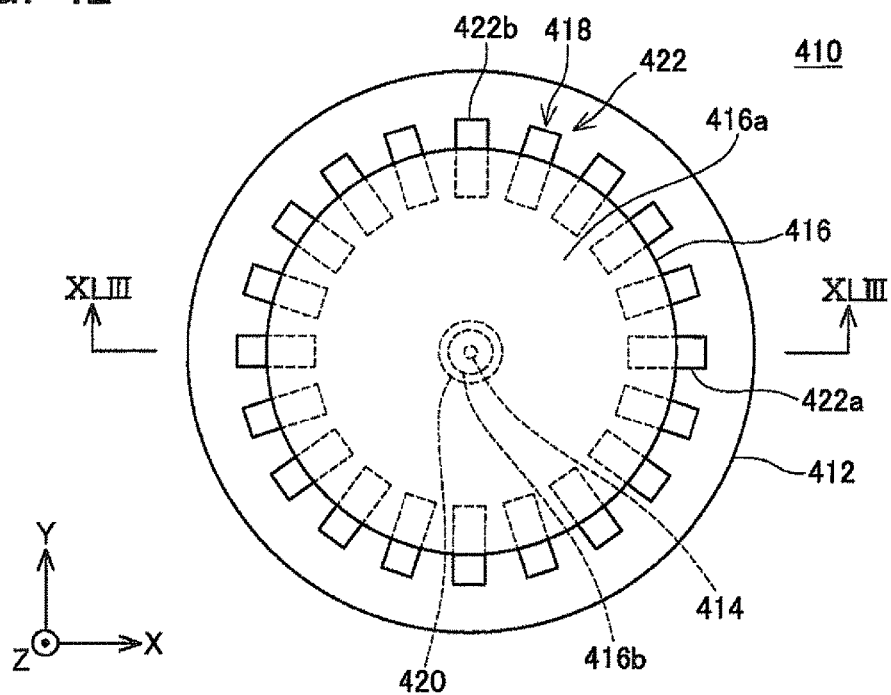
FIG. 42 is a top plan view showing a schematic configuration of a deflector 410 of an embodiment.
Figure 43:
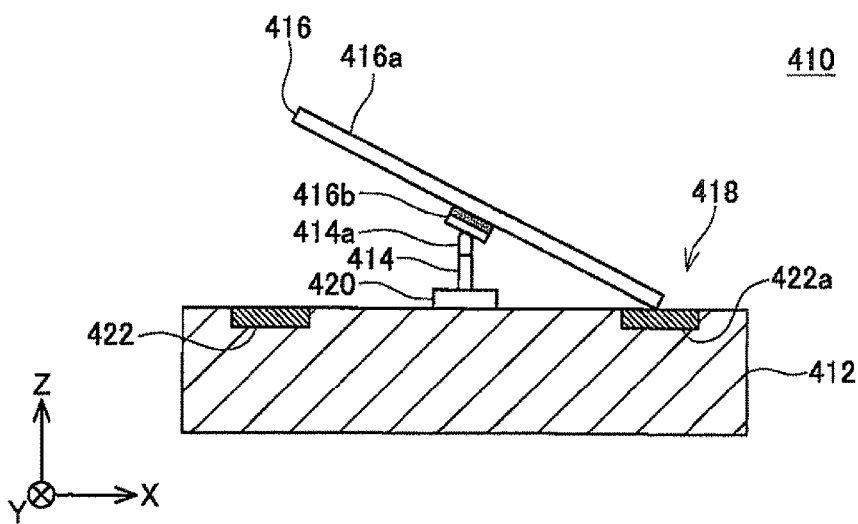
FIG. 43 is a longitudinal sectional view taken along XLIII-XLIII in FIG. 42, showing an example of a state where a swing plate 416 swings.

FIG. 42 and FIG. 43 each show a deflector 410 of another embodiment. The deflector 410 includes a substrate portion 412, a support column 414, a swing plate 416, a drive mechanism 418, and an adjustment mechanism 420. The substrate portion 412 is formed, for example, in a silicon wafer. The deflector 410 is a MEMS device manufactured by utilizing a semiconductor manufacturing process.

As shown in FIG. 43, the adjustment mechanism 420 is fixed to an upper surface of the substrate portion 412. The support column 414 extends upward from the adjustment mechanism 420. An upper end of the support column 414 is rounded, and is placed with the swing plate 416 thereon. The swing plate 416 is formed in a disc shape. The swing plate 416 is formed from silicon covered with an insulating film therearound and provided with conductivity. A reflective film 416a reflecting incident light is formed on an upper surface of the swing plate 416. The reflective film 416a is an evaporated film such as Al, for example.

The upper end of the support column 414 is plated with a plating 414a of a magnetic material. A permanent magnet 416b is provided on a part, abutting on the support column 414, of the swing plate 416. The permanent magnet 416b is arranged such that a polar direction of magnetic force is a direction orthogonal to the swing plate 416. In FIG. 43, a north pole of the permanent magnet 416b is hatched, and a south pole thereof is filled with white. The swing plate 416 is attracted to the support column 414 by the magnetic force of the permanent magnet 416b. The upper end of the support column 414 is rounded, and the swing plate 416 is swingable relative to three axes. In other words, the swing plate 416 is supported at a support point provided on the upper end of the support column 414 so as to be swingable relative to at least the two axes parallel to the substrate portion 412. The support point described herein means a point which the swing axis passes when the swing plate 416 swings.

The drive mechanism 418 includes a plurality of electrodes 422 formed on a surface of the substrate portion 412. The electrodes 422 are arranged at such a position as to overlap the end of the swing plate 416 in plan view of the deflector 410 at regular intervals at each prescribed azimuth angle. Each of the electrodes 422 is formed from a conductive material (e.g., metal or silicon provided with conductivity) covered with an insulating film therearound. Each electrode 422 can selectively apply a voltage between the swing plate 416 and the electrode 422.

For example, when a voltage is applied between an electrode 422a located in a direction X (rightward in FIG. 42) as viewed from the support point when viewing the deflector 410 in plan view from above, and the swing plate 416, torque is applied to the swing plate 416 such that the swing plate 416 is inclined in the direction X by electrostatic attraction between the electrode 422a and the swing plate 416. Consequently, as shown in FIG. 43, the swing plate 416 swings, and the end in the direction X of the swing plate 416 abuts on the electrode 422a. Unlike in this case, when a voltage is applied between an electrode 422b located in a direction Y (leftward in FIG. 42) as viewed from the support point when viewing the deflector 410 in plan view from above, and the swing plate 416, torque is applied to the swing plate 416 such that the swing plate 416 is inclined in the direction Y by electrostatic attraction between the electrode 422b and the swing plate 416. Consequently, the swing plate 416 swings, the end in the direction Y of the swing plate 416 abuts on the electrode 422b. The electrodes 422, which a voltage is applied between the swing plate 416 and, are successively changed in a clockwise direction or a counterclockwise direction, so that the swing plate 416 can continuously change the azimuth angle on a portion abutting on the substrate portion 412. In the deflector 410 of this embodiment, the electrodes 422, which a voltage is applied between the swing plate 416 and, are selected, so that the azimuth angle of the reflective film 416a can be arbitrarily adjusted. In the deflector 410 of this embodiment, a peripheral edge of the swing plate 416 corresponds to the contact edge, and the surface of the substrate portion 412 corresponds to the contact surface.

The adjustment mechanism 420 includes a linear actuator, and can cause the support column 414 to advance and retreat in a vertical direction in FIG. 43. In other words, the adjustment mechanism 420 can adjust a protrusion amount of the support column 414 from the substrate portion 412. The adjustment mechanism 420 adjusts the protrusion amount of the support column 414, so that an elevation angle of the reflective film 416a, at which the swing plate 416 swings and the end of the swing plate 416 abuts on the substrate portion 412, can be adjusted.

As described above, according to the deflector 410 of this embodiment, the azimuth angle and the elevation angle of the reflective film 416a can be arbitrarily adjusted. Scanning in the direction of latitude and the direction of longitude is enabled.

Although the drive mechanism 418 brings the contact edge of the swing plate 416 into contact with the surface of the substrate portion 412 by utilizing electrostatic force in the above-described embodiment, various aspects of the drive mechanism 418 other than the above may be used. For example, a plurality of electromagnets arranged outside may act on a magnetic field in a direction parallel to the substrate portion 412 with respect to the permanent magnet 416b of the swing plate 416, and the change in a direction of the magnetic field may cause the end of the swing plate 416 to abut on the substrate portion 412 at a desired azimuth angle.

Although the permanent magnet 416b is provided on a lower surface of the swing plate 416, the upper end of the support column 414 is rounded, and the support column 414 is plated with the plating 414a of the magnetic material, so that the swing plate 416 is supported so as to be swingable relative to at least the two axes parallel to the substrate portion 412 in the above-described embodiment, various supporting aspects of the swing plate 416 other than the above may be employed. For example, the swing plate 416 and the support column 414 may be formed from respective conductive materials, an insulator may be interposed between abutting portions of the swing plate 416 and the support column 414, and a voltage may be applied between the swing plate 416 and the support column 414, so that the swing plate 416 is attracted to the support column 414 by electrostatic force. Alternatively, non-volatile liquid may be applied to the abutting parts of the swing plate 416 and the support column 414, so that the swing plate 416 is attracted to the support column 414 by surface tension of the non-volatile liquid. Alternatively, the abutting parts of the swing plate 416 and the support column 414 may be bonded together with a soft adhesive. With such a configuration, the swing plate 416 is supported with respect to the support column 414 so as to be swingable relative to at least the two axes parallel to the substrate portion 412.

Figure 44:
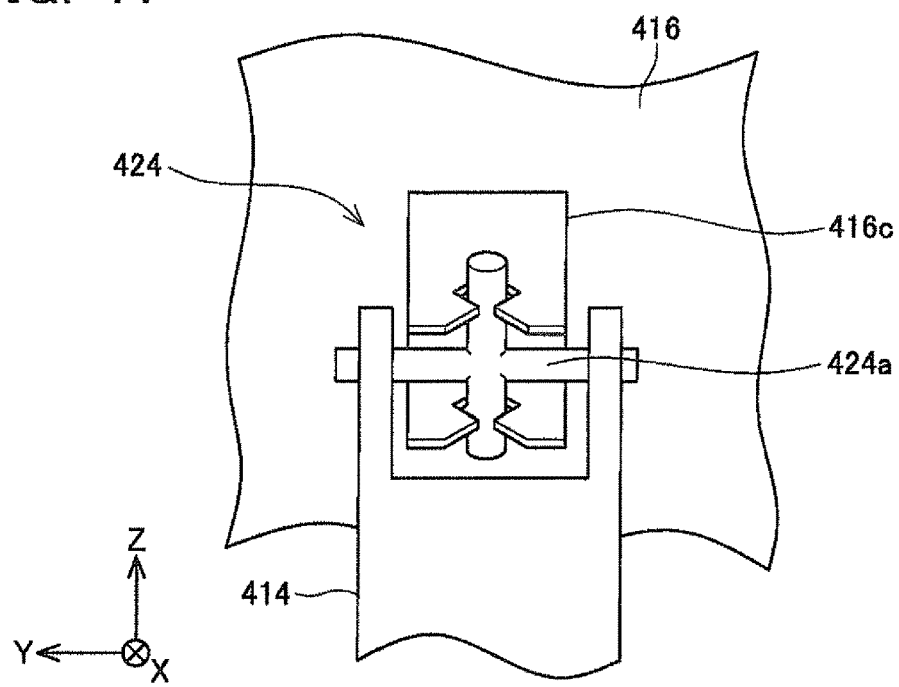
FIG. 44 is a side view showing an example of a state where a swing plate 416 and a support column 414 are connected by a biaxial joint 424.
Figure 45:
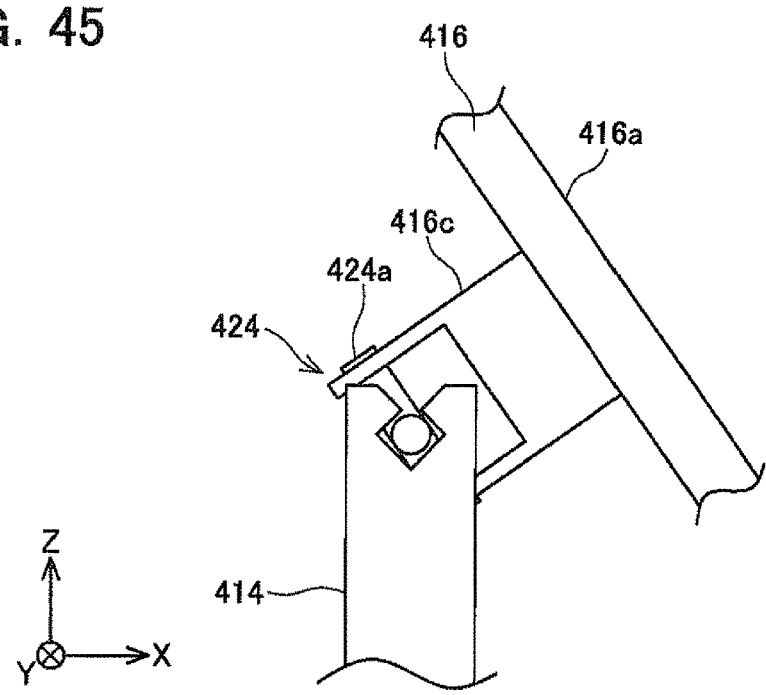
FIG. 45 is another side view showing an example of the state where the swing plate 416 and the support column 414 are connected by the biaxial joint 424.
Figure 46:
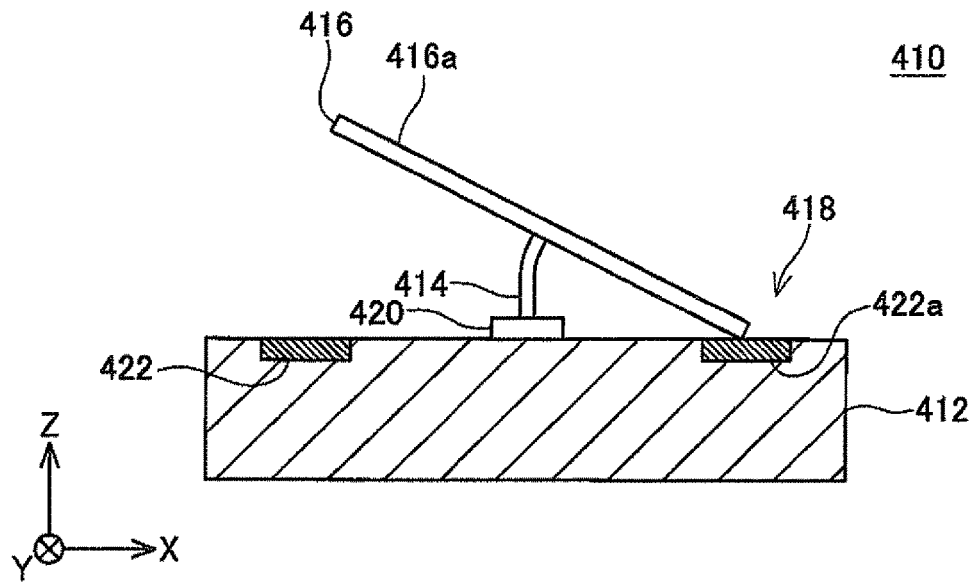
FIG. 46 is a figure showing an example of a configuration where the support column 414 with low bending rigidity is directly fixed to the swing plate 416.

Alternatively, as shown in FIG. 44 and FIG. 45, a connecting member 416c may be formed on the lower surface of the swing plate 416, and the upper end of the support column 414 and a lower end of the connecting member 416c may be connected with a biaxial joint 424. FIG. 44 and FIG. 45 each show a case of using a cardan joint using a cross-shaped connecting member 424a as the biaxial joint 424. With such a configuration, the swing plate 416 is supported with respect to the support column 414 so as to be swingable relative to at least the two axes parallel to the substrate portion 412. Alternatively, as shown in FIG. 46, bending rigidity in the direction X and the direction Y of the support column 414 may be made lower, and the upper end of the support column 414 may be directly fixed to the swing plate 416. Since the deflector is configured such that electrostatic attraction, magnetic attraction, or the like acts between the end of the swing plate 416 and the substrate portion 412, the swing plate 416 is attracted to and is in contact with the substrate portion 412, and the support column 414 is curved by this force. A protrusion amount of the support column 414 from the substrate portion 412 is relatively changed and adjusted, so that an angle (inclination) of the swing plate 416 formed by the substrate portion 412 can be changed. In this case, when torque is applied to the swing plate 416, the support column 414 warps, and the swing plate 416 swings. With such a configuration, the swing plate 416 is supported with respect to the support column 414 so as to be swingable relative to at least the two axes parallel to the substrate portion 412.

The shape of the swing plate 416 is not limited to a disc shape, and various shapes may be employed. For example, the swing plate 416 may be formed in an oval or a polygon.

Figure 47:
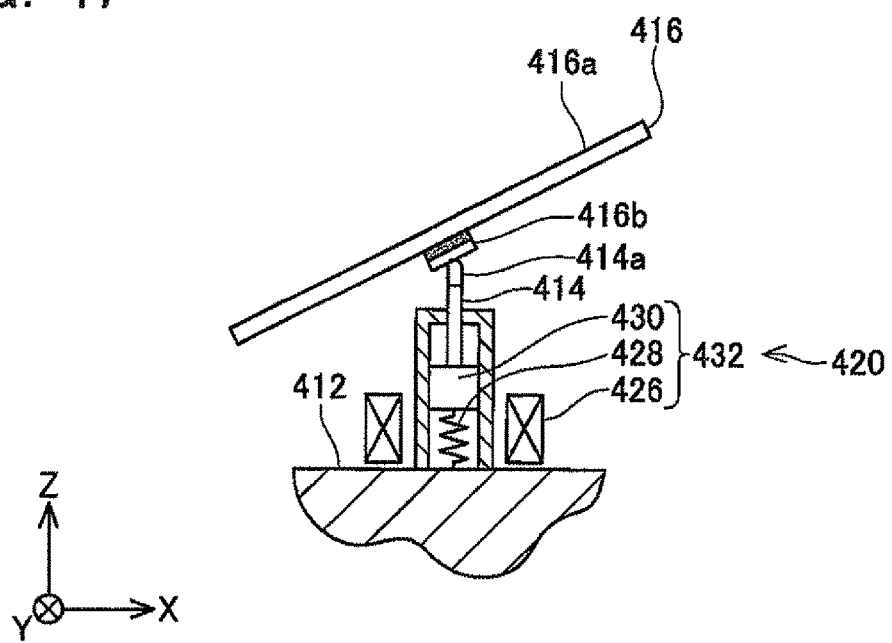
FIG. 47 is a figure showing an example of a state in which an adjustment mechanism 420 is implemented by using a linear actuator 432.
Figure 48:
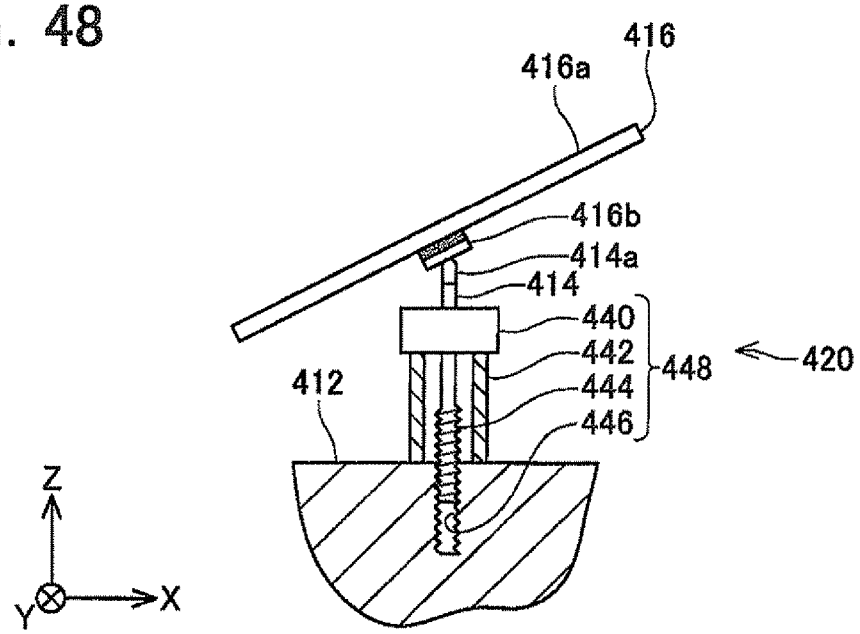
FIG. 48 is a figure showing an example of a state in which the adjustment mechanism 420 is implemented by using a linear actuator 448.

Various aspects of the adjustment mechanism 420 may be used. For example, as shown in FIG. 47, the adjustment mechanism 420 adjusting the protrusion amount of the support column 414 can be implemented by using an electromagnetic linear actuator 432 including solenoids 426, a spring 428, and an armature 430. Alternatively, as shown in FIG. 48, the adjustment mechanism 420 adjusting the protrusion amount of the support column 414 can be implemented by using a linear actuator 448 including a motor 440, guides 442, an external thread 444, and an internal thread 446. Alternatively, the adjustment mechanism 420 adjusting the protrusion amount of the support column 414 can be implemented by utilizing various linear actuators such as an electrostatic linear actuator, a gas-operated linear actuator, and a hydraulic linear actuator.

Figure 49:
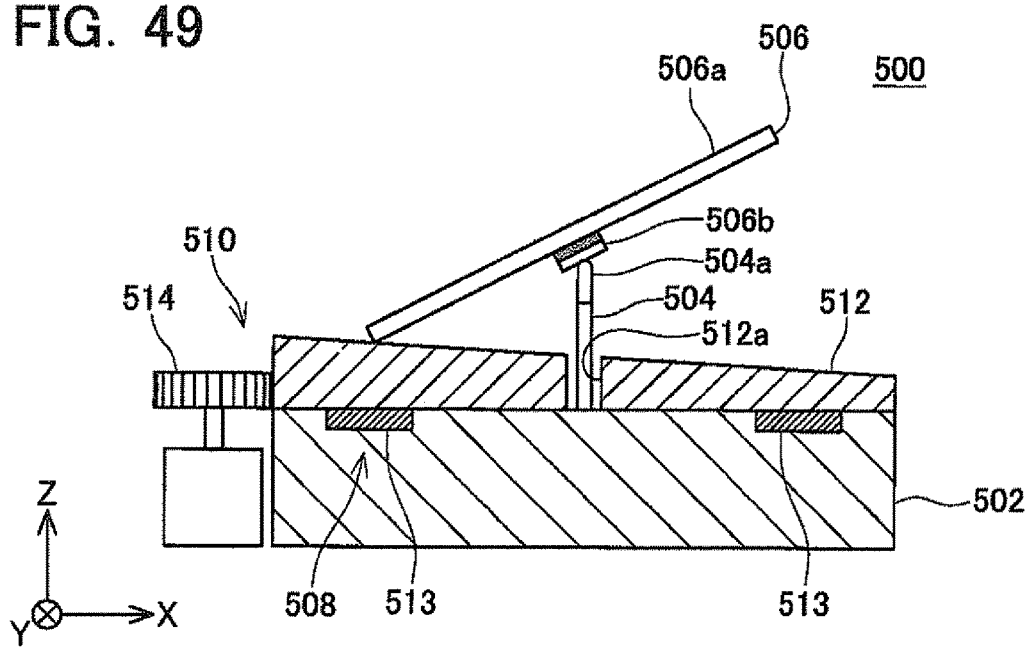
FIG. 49 is a longitudinal sectional view showing a schematic configuration of a deflector 500 of an embodiment.

FIG. 49 shows a deflector 500 of another embodiment. The deflector 500 includes a substrate portion 502, a support column 504, a swing plate 506, a drive mechanism 508, and an adjustment mechanism 510. The substrate portion 502 is formed, for example, in a silicon wafer. The deflector 500 is a MEMS device manufactured by utilizing a semiconductor manufacturing process.

The adjustment mechanism 510 includes an adjustment plate 512 and a rotation mechanism 514. The adjustment plate 512 is placed on an upper surface of the substrate portion 502 so as to be relatively rotatable with respect to a direction orthogonal to the substrate portion 502. A through hole 512a through which the support column 504 passes is formed on a center of the adjustment plate 512. The support column 504 has a lower end fixed to the substrate portion 502. An upper end of the support column 504 is rounded, and is placed with the swing plate 506 thereon. The swing plate 506 is formed in a disc shape. The swing plate 506 is formed from silicon covered with an insulating film therearound and provided with conductivity. A reflective film 506a reflecting incident light is formed on an upper surface of the swing plate 506. The reflective film 506a is an evaporated film such as Al, for example.

The upper end of the support column 504 is plated with a plating 504a of a magnetic material. A permanent magnet 506b is provided on a part, abutting on the support column 504, of the swing plate 506. The permanent magnet 506b is arranged such that a polar direction of magnetic force is a direction orthogonal to the swing plate 506. The swing plate 506 is attracted to the support column 504 by the magnetic force of the permanent magnet 506b. The upper end of the support column 504 is rounded, and the swing plate 506 is swingable relative to three axes. In other words, the swing plate 506 is supported at a support point provided on the upper end of the support column 504 so as to be swingable relative to at least the two axes parallel to the substrate portion 502.

The drive mechanism 508 includes a plurality of electrodes 513 arranged on a surface of the substrate portion 502. The electrodes 513 are arranged, at regular intervals at each prescribed azimuth angle, at such a position as to overlap the end of the swing plate 506 in plan view of the deflector 500. Each of the electrodes 513 is formed from a conductive material (e.g., metal or silicon provided with conductivity) covered with an insulating film therearound. Each electrode 513 can selectively apply a voltage between the swing plate 506 and the electrode 513. When a voltage is applied between a specified electrode 513 and the swing plate 506, torque is applied to the swing plate 506 by electrostatic attraction between the electrodes 513 and the swing plate 506. Consequently, the swing plate 506 swings, and the end of the swing plate 506 abuts on a surface of the adjustment plate 512. Also in the deflector 500 of this embodiment, the electrodes 513, which a voltage is applied between the swing plate 506 and, are selected, so that the azimuth angle of the reflective film 506a can be arbitrarily adjusted, similarly to the deflector 410 of the above-described embodiment. In the deflector 500 of this embodiment, a peripheral edge of the swing plate 506 corresponds to the contact edge, the adjustment plate 512 corresponds to the connecting member, and the surface of the adjustment plate 512 corresponds to the contact surface.

The adjustment plate 512 is formed such that a height in a circumferential direction is uneven. Accordingly, the rotation mechanism 514 rotates the adjustment plate 512, so that the adjustment mechanism 510 increases and reduces the height of the adjustment plate 512 at an arbitrary azimuth angle. In other words, the adjustment mechanism 510 can adjust a protrusion amount, from the substrate portion 502, of the contact surface of the adjustment plate 512. The adjustment mechanism 510 adjusts the protrusion amount of the contact surface of the adjustment plate 512, so that an elevation angle of the reflective film 506a, at which the swing plate 506 swings and the end of the swing plate 506 abuts on the adjustment plate 512, can be adjusted.

As described above, according to the deflector 500 of this embodiment, the azimuth angle and the elevation angle of the reflective film 506a can be arbitrarily adjusted. Scanning in the direction of latitude and the direction of longitude is enabled.

Figure 50:
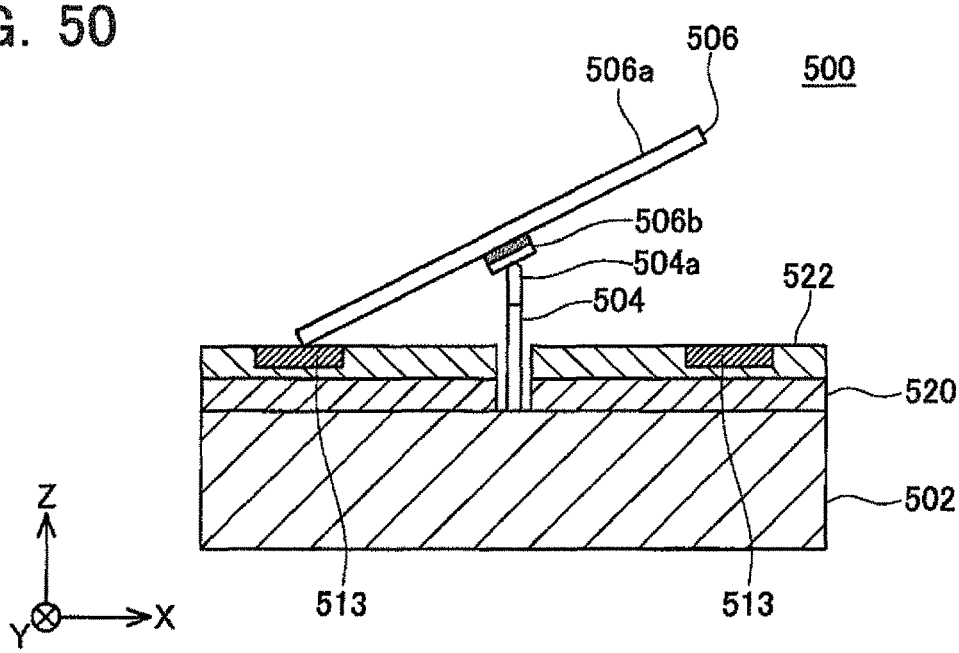
FIG. 50 is a longitudinal sectional view showing a schematic configuration of another aspect of the deflector 500 of the embodiment.
Figure 51:
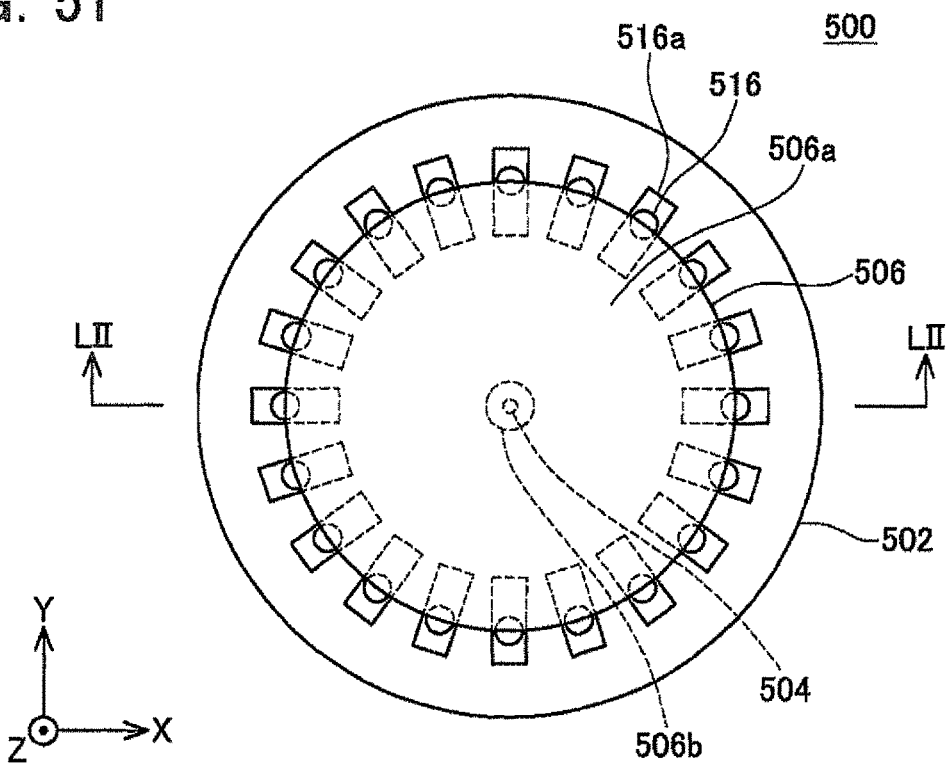
FIG. 51 is a top plan view showing a schematic configuration of another aspect of the deflector 500 of the embodiment.
Figure 52:
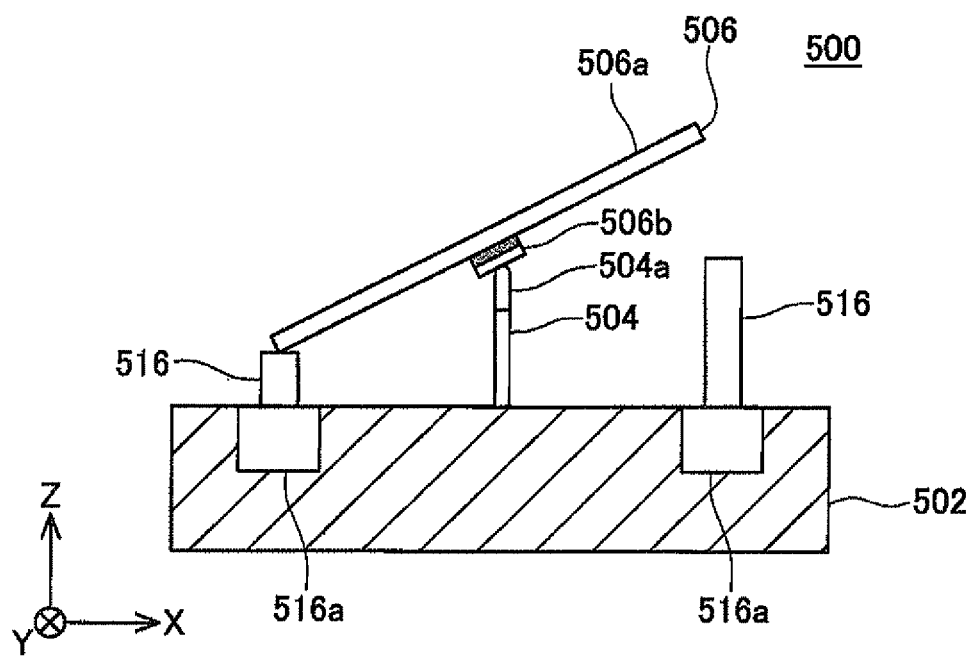
FIG. 52 is a longitudinal sectional view taken along LII-LII in FIG. 51, showing an example of a state where a swing plate 506 swings.

As the configuration of adjusting the protrusion amount of the contact member, various configurations other than the above may be employed. For example, as shown in FIG. 50, an extension plate 520 made of a piezoelectric element, and an adjustment plate 522 formed so as to have an even height in a circumferential direction may be successively stacked on the upper surface of the substrate portion 502, a thickness of the extension plate 520 may be adjusted, thereby enabling adjustment of a protrusion amount, from the substrate portion 502, of a contact surface of an adjustment plate 522. The protrusion amount of the adjustment plate 522 from the substrate portion 502 can be also adjusted by raising and lowering the extension plate 520 with electromagnetic drive or mechanical drive from outside other than piezoelectric actuation. In this case, the extension plate 520 may be made from a magnetic material in a case of the electromagnetic drive, and from an insulating material or a rigid material which is subjected to insulation treatment in a case of the mechanical drive, other than the piezoelectric material. Alternatively, as shown in FIG. 51 and FIG. 52, contact columns 516 having upper surfaces formed with contact surfaces may be arranged on the upper surface of the substrate portion 502 at equal intervals at each prescribed azimuth angle, and protrusion amounts of the contact columns 516 with respect to the substrate portion 502 may be increased and reduced by actuators 516a provided corresponding to the respective contact columns 516. In this case, electrodes 513 can be formed inside the contact columns 516.

Representative and non-limiting specific examples of the present invention are described herein with referring to the drawings. The detailed description merely intends to illustrate the details to a person skilled in the art for carrying out the preferred examples of the present invention, while it does not intend to limit the scope of the present invention. Additional features and teachings may be used separately or in conjunction with other features or teachings in order to provide a further improved deflector.

Combinations of the features and steps disclosed above in the detailed description are not requisite for carrying out the present invention in its broadest meaning, but are particularly described merely for illustrating representative specific examples of the present invention. Various features of the above-described representative specific examples as well as various features of those described in independent and dependent claims are not the ones which have to be combined as the specific examples or in the same order as described herein in order to provide additional and useful modes of the present invention.

All features described in the present application and/or claims intend to be disclosed, individually and independently each other, as limitations for specific items described in the disclosure and claims at the time of filing the present application, separately from a structure of the features described in examples and/or claims. Descriptions on all numerical ranges and groups or sets intend to disclose intermediate aspects thereof as limitations for specific items described in the disclosure and claim at the time of filing the present application.

An embodiment of the present invention is described in detail above, but this is merely an example of the present invention, and does not limit the claims. The techniques described in the claims include various alterations and modifications of the embodiment described above as an example. The technical elements described in the present application and drawings exhibit technical usefulness either independently or in various combinations, and are not limited to the combinations described in the claims at the time of filing. Further, the techniques cited in the present application and drawings achieve a plurality of objects simultaneously, and technical usefulness is attained simply by achieving one of these objects.

What is claimed is:

1. A deflector comprising:
a substrate portion;
a swing portion;
a reflective portion;
a support portion; and
an electrostatic or magnetic drive mechanism; and
a biasing mechanism, wherein
the swing portion is swingably placed on a first end of the support portion,
a second end of the support portion is fixed to the substrate portion,
the reflective portion is formed on the swing portion,
the electrostatic or magnetic drive mechanism has a component configured to apply torque around a swing axis to the swing portion,
the biasing mechanism is configured to bias the swing portion toward the support portion, at least when force in a separating direction from the support portion acts on the swing portion,
the biasing mechanism is any one of a first biasing mechanism and a second biasing mechanism,
the first biasing mechanism includes an insulator provided on at least one of the support portion and the swing portion, and voltage applying mechanism for applying a voltage between the support portion and the swing portion, and biases the swing portion toward the support portion by utilizing electrostatic force,
the second biasing mechanism includes a magnet provided on the swing portion, and a magnetic material provided on the support portion, and biases the swing portion toward the support portion by utilizing magnetic force.

2. The deflector according to claim 1, wherein
a convex portion is formed on a part, abutting on the movable portion, of the support portion, and
a concave portion is formed on a part, abutting on the support portion, of the movable portion.

3. A deflector comprising:
a substrate portion;
a swing portion;
a reflective portion;
a support portion;
an electrostatic or magnetic drive mechanism; and
a biasing mechanism, wherein
a first end of the support portion is fixed to the swing portion,
a second end of the support portion is swingably placed on the substrate portion,
the reflective portion is formed on the swing portion,
the electrostatic or magnetic drive mechanism has a component configured to apply torque around a swing axis to the swing portion,
the biasing mechanism is configured to bias the support portion toward the substrate portion, at least when force in a separating direction from the substrate portion acts on the support portion,
the biasing mechanism is any one of a third biasing mechanism, a fourth biasing mechanism, and a fifth biasing mechanism,
the third biasing mechanism includes an insulator provided on at least one of the substrate portion and the support portion, and voltage applying means for applying a voltage between the substrate portion and the support portion, and biases the support portion toward the substrate portion by utilizing electrostatic force,
the fourth biasing mechanism includes a magnet provided on the support portion, and a magnetic material provided on the substrate portion, and biases the support portion toward the substrate portion by utilizing magnetic force, and
the fifth biasing mechanism includes an adhesive bonding the abutting portions of the substrate portion and the support portion together, and biases the support portion toward the substrate portion by utilizing restoring force of the adhesive, when the force of separating the support portion from the substrate portion acts.

4. The deflector according to claim 3, wherein
a convex portion is formed on a part, abutting on the substrate portion, of the support portion, and
a concave portion is formed on a part, abutting on the support portion, of the substrate portion.

5. A deflector comprising:
a substrate portion;
a movable portion supported at a support point, a position thereof with respect to the substrate portion being substantially fixed, so as to be swingable relative to three axes of a pitch axis, a roll axis and a yaw axis;
a reflective portion formed on the movable portion such that a reflective surface thereof is orthogonal to the yaw axis; and
an electrostatic or magnetic drive mechanism having a component configured to rotationally drive the movable portion about the yaw axis such that a contact edge of the movable portion is brought into contact with a surface of the substrate portion, wherein
the movable portion has a shape such that a distance from the support point to the contact edge changes according to a phase angle.

6. The deflector according to claim 5, wherein
the movable portion has a shape such that a distance from the support point to the contact edge in a direction orthogonal to the yaw axis changes according to the phase angle.

7. The deflector according to claim 6, wherein
the contact edge of the movable portion has any one of a first contact edge shape, a second contact edge shape, and a third contact edge shape,
the first contact edge shape is such that the contact edge of the movable portion is an oval, a center thereof being the support point when viewed on a plane orthogonal to the yaw axis,
the second contact edge shape is such that the contact edge of the movable portion is a circle, a center thereof being at a position offset from the support point when viewed on the plane orthogonal to the yaw axis, and
the third contact edge shape is such that the contact edge of the movable portion is a polygon, a center thereof being the support portion when viewed on the plane orthogonal to the yaw axis.

8. The deflector according to claim 5, wherein
the movable portion has a shape such that a distance from the reflective surface to the contact edge in a yaw axis direction changes according to the phase angle.

9. The deflector according to claim 5, further comprising
a movable portion-side support portion having an upper end fixed to the movable portion, wherein
a support point is provided on a lower end of the movable portion-side support portion.

10. A deflector comprising:
a substrate portion;
a swing portion supported at a support point, a position thereof with respect to the substrate portion being substantially fixed, so as to be swingable relative to at least two axes parallel to the substrate portion in;
a reflective portion formed on the swing portion;
an electrostatic or magnetic drive mechanism having a component configured to cause the swing portion to swing, and causing a contact edge of the swing portion to abut on a contact surface of the substrate portion at a desired azimuth angle; and
an actuator having a component configured to adjust a distance from the support point to the contact surface in a direction orthogonal to the substrate portion.

11. The deflector according to claim 10, further comprising
a support member supported by the substrate portion and provided with a support point on an end in the direction orthogonal to the substrate portion, wherein
the actuator adjusts a protrusion amount of the support point from the substrate portion.

12. The deflector according to claim 10, further comprising
a contact member supported by the substrate portion and formed with a contact surface, wherein
the actuator adjusts a protrusion amount, from the substrate portion, of the contact surface, on which the contact edge of the swing portion abuts.

* * * * *